United States Patent [19]
Morishita

[11] Patent Number: 5,734,183
[45] Date of Patent: Mar. 31, 1998

[54] HETEROJUNCTION BIPOLAR TRANSISTOR STRUCTURE

[75] Inventor: Masakazu Morishita, Atsugi, Japan

[73] Assignee: Canon Kabushiki Kaisha, Japan

[21] Appl. No.: 412,847

[22] Filed: Mar. 29, 1995

Related U.S. Application Data

[63] Continuation of Ser. No. 985,539, Dec. 3, 1992, abandoned, which is a continuation of Ser. No. 658,502, Feb. 21, 1991, abandoned.

[30] Foreign Application Priority Data

Feb. 22, 1990 [JP] Japan .................................. 2-042066
Feb. 22, 1990 [JP] Japan .................................. 2-042067
Feb. 22, 1990 [JP] Japan .................................. 2-042068

[51] Int. Cl.$^6$ ................. H01L 31/0328; H01L 31/0336; H01L 29/00
[52] U.S. Cl. ................... 257/197; 257/198; 257/557
[58] Field of Search ..................... 357/34, 35, 4, 357/16, 63; 257/197, 198, 191, 591, 592, 593

[56] References Cited

U.S. PATENT DOCUMENTS 4,672,413  6/1987  Gardner ............................. 357/6
4,889,824  12/1989 Selle et al. ....................... 257/197
4,987,468  1/1991  Thornton .......................... 257/197

OTHER PUBLICATIONS

1989 Symposium On VLSI Technology, G.L. Patton et al May 22–25, 1989; pp. 95–96; "SiGe Polyemitter HBT".
Warnock et al; "Boron Doped Emitter For High Performance . . . "; Proceedings of 1989 Bipolar circuits and Technology; Sep. 1989; pp. 186–189.
Van Halen et al; "High Gain Bipolar Transistors With Polysilicon Tunnel Junction Emitter Contacts"; IEEE Transactions On Electron Devices, vol. ED–32, No. 7; Jul. 1985.
Warnock et al; "Boron Doped Emitter For High Performance Vertical PNP Transistors" Proceedings of the 1989 Bipolar Circuits and Technology; Sep. 1989; pp. 186–189.
IEEE Transactions On Electron Devices, vol. 36, No. 10, Oct. 1989, pp. 2156–2164, R.L. Thorton et al., "Demonstration and Properties of a Planar Heterojunction Bipolar Transistor with Lateral Current Flow".
Thornton et al., "Demonstration and Properties of a Planar Heterojunction Bipolar Transistor with Lateral Current Flow", IEEE Transaction of Electron Devices, vol. 36, No. 10, Oct. 1989, pp. 2156–2164.
Harame et al., "High–Performance Si and SeGe–Base PNP Transistors", International Electron Devices Meeting (IEDM) 11–14, Dec. 1988, pp. 889–891.
Moravvej–Farshi et al., "Improvements in Current Gain and Breakdown Voltage of Silicon MIS Heterojunction Emitter Transistors", I.E.E.E. Electron Device Letters, vol. EDL–7, No. 11, Nov. 1986, pp. 632–634.
P. Van Halen et al., "High–Gain Bipolar Transistors With Polysilicon Tunnel Junction Emitter Contacts," IEEE Transactions of Electron Devices, vol. ED–32, No. 7, Jul. 1985, pp. 1307–1313.

Primary Examiner—Wael Fahmy
Attorney, Agent, or Firm—Fitzpatrick, Cella, Harper & Scinto

[57] ABSTRACT

A semiconductor device is provided with an emitter area and a collector area of a first conductive type and a base area of a second conductive type, arranged in a horizontal structure. The semiconductor device comprises an area constituting at least a part of the base area, being in contact with a part of the base area at least positioned between the emitter and collector areas, and having a narrower forbidden band than in the base area.

38 Claims, 10 Drawing Sheets

FIG. 1
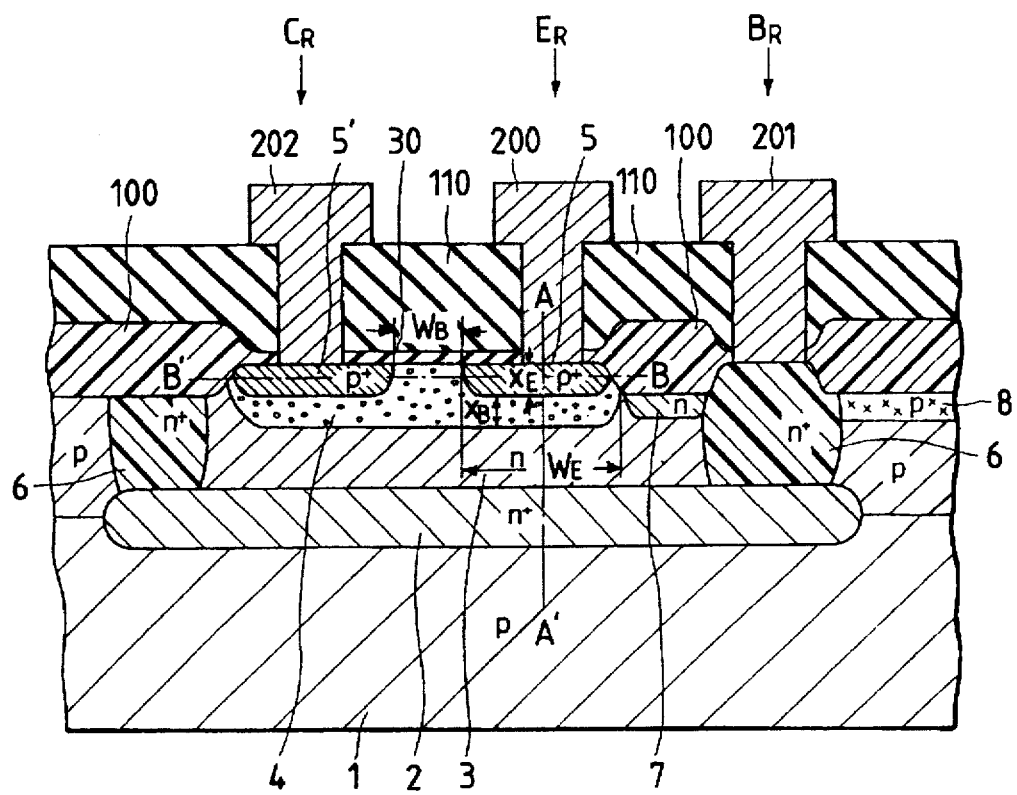
FIG. 2A
FIG. 2B
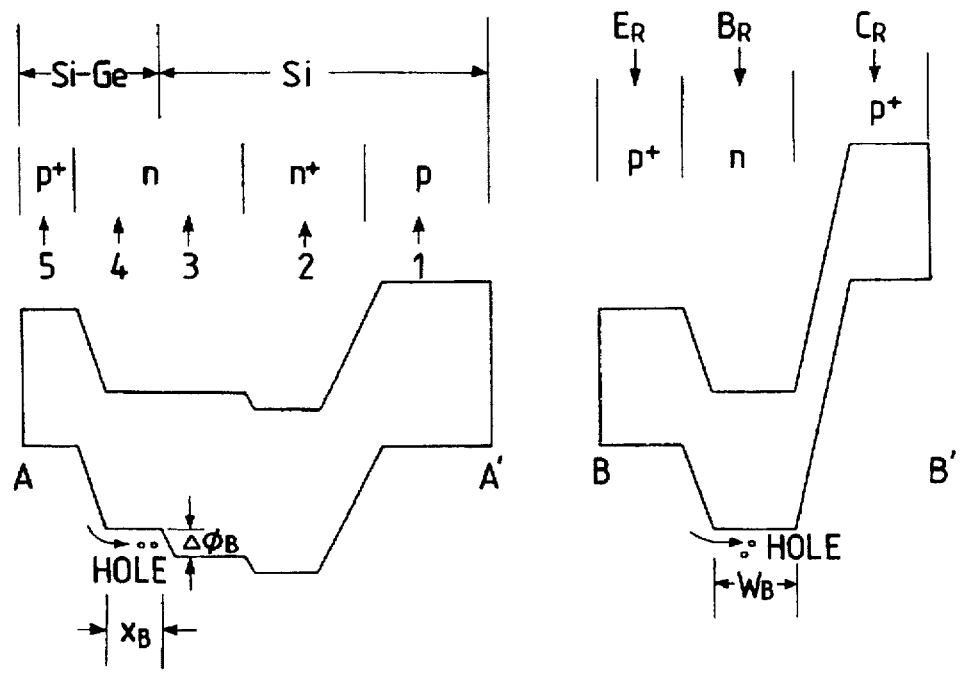

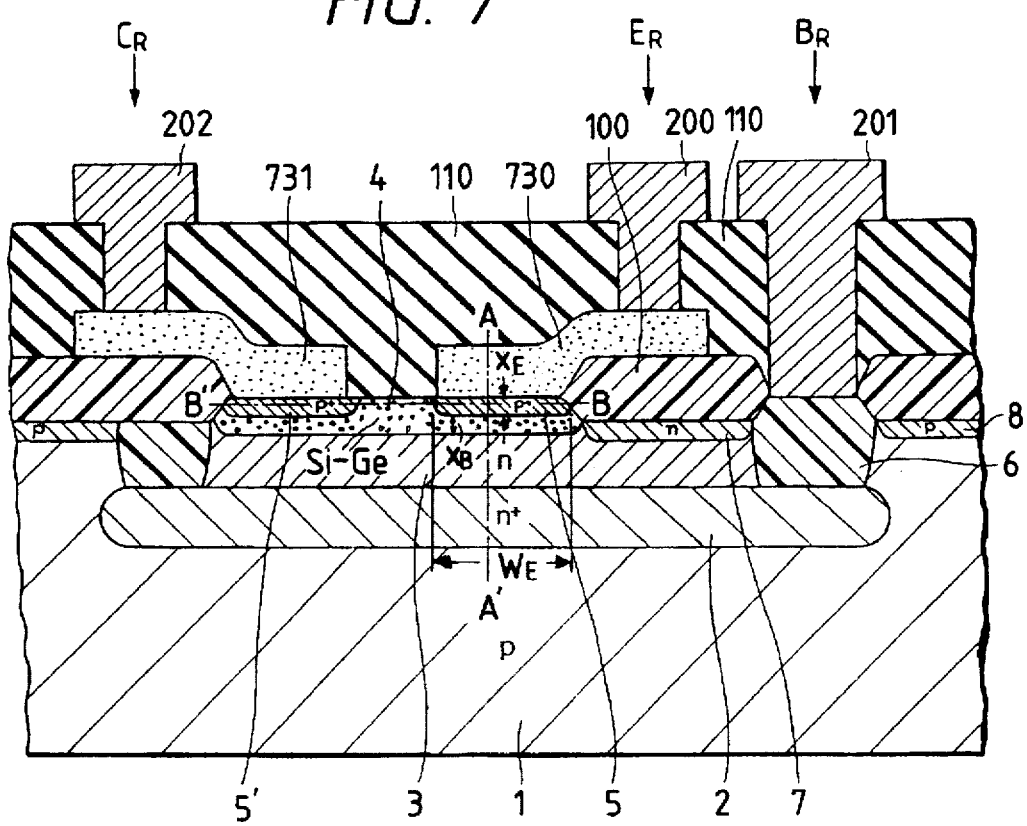
FIG. 7
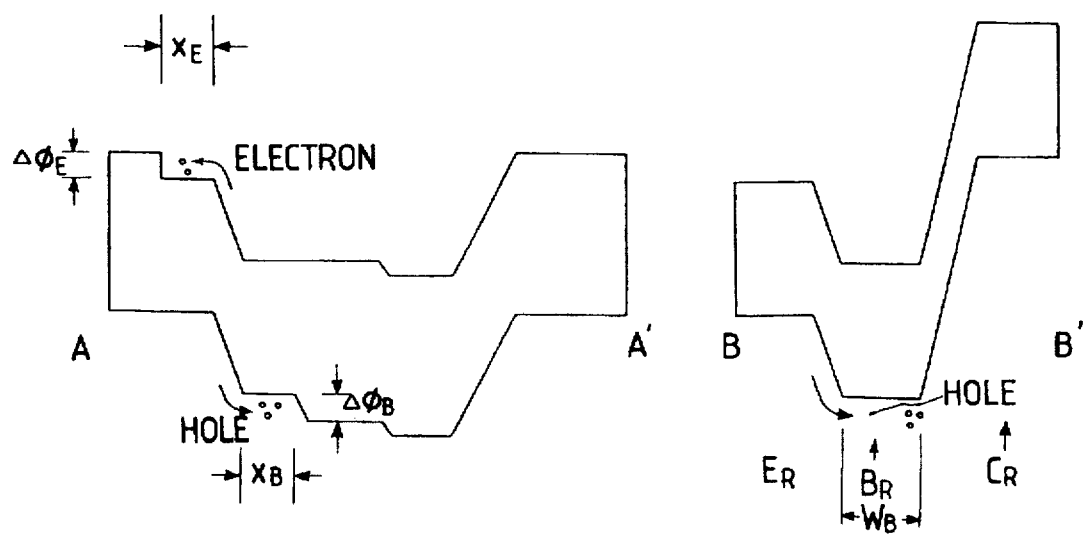
FIG. 8A
FIG. 8B

HETEROJUNCTION BIPOLAR TRANSISTOR STRUCTURE

This application is a continuation of application Ser. No. 07/985,539 filed Dec. 3, 1992, now abandoned, which is a continuation of application Ser. No. 07/658,502 filed Feb. 21, 1991, now abandoned.

BACKGROUND OF THE INVENTION

1. Field of the Invention

The present invention relates to a semiconductor device including an integrated circuit on a substrate, and more particularly to a semiconductor device including lateral bipolar transistors constituting said integrated circuit.

2. Related Background Art

There is already known a lateral bipolar transistor in which the current flows lateral, namely along the surface of substrate. Such lateral bipolar transistor is widely used because of the advantage that it can be easily compatible with a vertical bipolar transistor in which the current flows vertically, namely in the direction of depth of substrate. For example, a lateral bipolar transistor of pnp structure can be loaded on a same substrate with a vertical bipolar transistor of opposite npn structure.

However, the conventional lateral bipolar transistor has been associated with a drawback that the current amplification factor $h_{FE}$ cannot be increased because of the following reasons.

This is due to facts that, because of a low emitter-collector breakdown voltage resulting from symmetrical arrangement of the emitter area and the collector area in such lateral bipolar transistor, the base width is apt to be influenced by the collector voltage resulting eventually in so-called early effect (spreading of depletion layer), and that, because of wide internal spreading of the current flowing from the emitter into the base, the recombined current in the base area governs the function and the increased base current reduces significantly the current amplification factor $h_{FE}$.

SUMMARY OF THE INVENTION

In consideration of the foregoing, an object of the present invention is to provide a semiconductor device of a structure capable of increasing the current amplification factor of the lateral bipolar transistor.

Another object of the present invention is to provide a semiconductor device having an emitter area and a collector area of a first conductive type and a base area of a second conductive type, formed in a lateral structure, comprising an area which is at least a part of the base area, in contact with at least a part of said base area positioned between said emitter and collector areas, and has a narrower forbidden band than in said base area.

Still another object of the present invention is to provide a semiconductor device having an emitter area and a collector area of a first conductive type and a base area of a second conductive type, formed in a lateral structure, comprising a semiconductive layer formed at least in a part of the base area and serving as a barrier layer, in the direction of depth of said base area, to the minority carriers injected from the emitter area to the base area.

Still another object of the present invention is to provide a semiconductor device having an emitter area and a collector area of a first conductive type and a base area of a second conductive type, formed in a lateral structure, comprising a barrier formed at least in a part of said emitter area and functioning, in the direction of depth of said emitter area, to the minority carriers of said base area, and a semiconductor layer formed on said emitter layer and having a wider forbidden band than in the material of said emitter area.

Still another object of the present invention is to provide a semiconductor device having an emitter area and a collector area of a first conductive type and a base area of a second conductive type, formed in a lateral structure, comprising a barrier formed at least in a part of said base area and functioning in the direction of depth to the minority carriers injected from said emitter area into said base area, a thin film formed on said emitter area and passing a tunnel current, and a polycrystalline layer formed on said thin film and having a wider forbidden band than in the material of said emitter area.

BRIEF DESCRIPTION OF THE DRAWINGS

FIG. 1 is a schematic cross-sectional view of a first embodiment of the present invention;

FIG. 2A is a schematic view showing the potential distribution along a line A–A' in FIG. 1;

FIG. 2B is a schematic view showing the potential distribution along a line B–B' in FIG. 1;

FIG. 7 is a schematic cross-sectional view of a fourth embodiment;

FIG. 8A is a schematic view showing the potential distribution along a line A–A' in FIG. 7;

FIG. 8B is a schematic view showing the potential distribution along a line B–B' in FIG. 7;

DETAILED DESCRIPTION OF THE PREFERRED EMBODIMENTS

Figure 3:
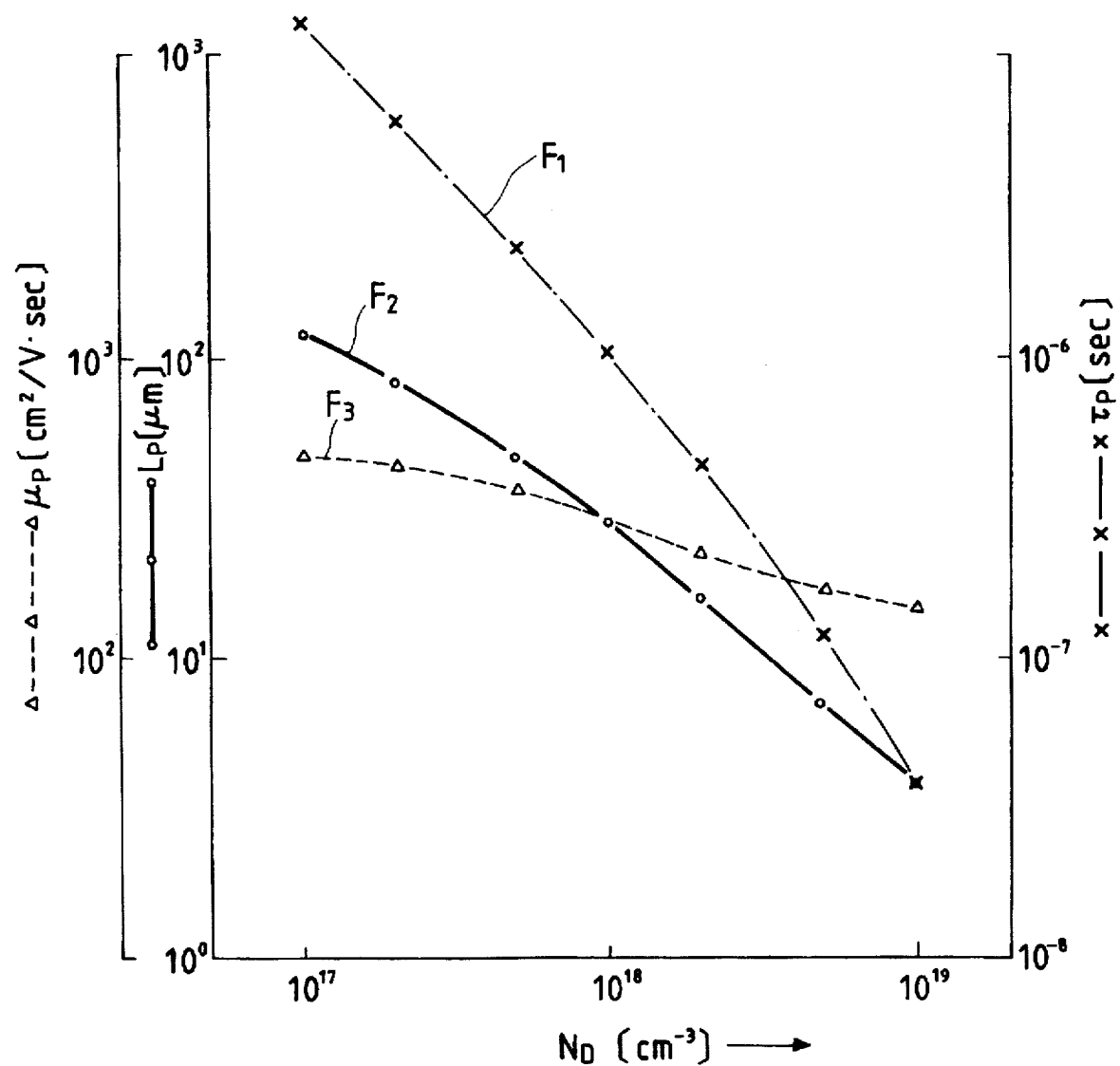
FIG. 3 is a chart showing the mobility, life and diffusion length of positive holes as a function of concentration of n-type impurity.

The foregoing objects can be attained, according to the present invention, by a semiconductor device having an emitter area and a collector area of a first conductive type and a base area of a second conductive type, formed as a lateral structure, comprising an area which is formed at least as a part of said base area, is in contact with at least a part of said base area positioned between said emitter and collector areas, and has a narrower forbidden band than in said base area.

Also said objects can be attained, according to the present invention, by a semiconductor device having an emitter area and a collector area of a first conductive type and a base area of a second conductive type, formed as a lateral structure, comprising a semiconductive layer formed at least in a part of said base area and functioning as a barrier in the direction of depth of said base area to the minority carriers injected from said emitter area into said base area.

Also said objects can be attained, according to the present invention, by a semiconductor device having an emitter area and a collector area of a first conductive type and a base area of a second conductive type, formed as a lateral structure, comprising a barrier formed in at least a part of said emitter area and functioning in the direction of depth of said emitter area to the minority carriers of said base area, and a semiconductive layer formed on said emitter area and having a wider forbidden band than in the material of said emitter area.

Furthermore said objects can be attained, according to the present invention, by a semiconductor device having an emitter area and a collector area of a first conductive type and a base area of a second conductive type, comprising a barrier formed in at least a part of said base area and functioning in the direction of depth to the minority carriers injected from said emitter area to said base area, a thin film formed on said emitter area and passing a tunnel current, and a polycrystalline layer formed on said thin film and having a wider forbidden band than in the material of said emitter area.

Thus, according to the present invention, a heterogeneous junction is formed in the base area to constitute a potential barrier, functioning in the direction of depth of said emitter area, to the minority carriers in said base area, thereby preventing the carriers injected from the emitter area from diffusion into the interior of the substrate and thus increasing the current amplification factor $h_{FE}$ of the lateral bipolar transistor.

Said barrier can be rendered sufficiently effective even at room temperature, by selecting the magnitude of potential of said barrier at least equal to the corresponding thermal energy at the desired temperature.

Also such barrier, for preventing the diffusion of emitter current in the direction of depth of the substrate, can be easily formed by a heterogeneous junction.

Furthermore, the present invention can drastically reduce the recombination current of positive holes, by forming the area constituting said barrier in such a manner that it surrounds the emitter and collector areas and that the distance from the emitter area to the interface of said barrier constituting area at the base area is shorter at least than the diffusion length of the minority carriers.

Furthermore, the present invention can uniformly reduce the contact resistance of the emitter, base and collector areas by surrounding at least a part of said areas with said barrier constituting area.

Furthermore, according to the present invention, a potential barrier consisting for example of a heterogeneous junction is formed at the interface of the emitter and base areas so as to be effective to the minority carriers in the base area in the direction of depth of the emitter area, thereby preventing the emitter current from diffusion into the interior of the substrate, and preventing the increase in the current resulting from recombination of the minority carriers with the majority carriers in the base area, and a heterogeneous junction is also provided on the emitter area to reduce the current component injected from the base area into the emitter area, whereby an increase in the current amplification factor of the lateral bipolar transistor can be realized.

Also the depth of said emitter area is made at least shorter than the diffusion length of the minority carriers of the emitter area injected from said base area, whereby a component of the base current, namely the diffusion of the minority carriers of the emitter area, can be effectively reduced.

Furthermore, the recombination current resulting from recombination of the minority carriers with the majority carriers can be drastically reduced by forming said area constituting the barrier so as to surround said emitter and collector areas and selecting the distance, from said emitter area to the interface between said barrier constituting area and the base area, at least shorter than the diffusion length of the minority carriers injected from said emitter area.

Furthermore, according to the present invention, the depth of the interface constituting said barrier is made shallower than the depth of said emitter and collector areas to concentrate the emitter current in the vicinity of the surface of the substrate. Such current concentration close to the surface of the substrate makes the active area of the device thinner, thereby responding to the requirements of higher level of integration and finer geometry.

Furthermore, according to the present invention, a heterogeneous junction consisting of a mixed crystal layer such as $Si_{1-x}Ge_x$ and a monocrystalline layer such Si is formed at the interface of the emitter and base areas to constitute a potential barrier, functioning in the direction of depth of said emitter area, to the minority carriers in said emitter area, thereby preventing the diffusion of the emitter current into the interior of the substrate and also preventing the increase in the recombination current in the base area, and a thin tunnel film and a heterogeneous junction consisting of a polycrystalline layer and a monocrystalline layer are formed also on the emitter area to prevent the diffusion of electrons injected from the base area into the emitter area, whereby an increase in the current amplification factor $h_{FE}$ of the lateral bipolar transistor can be realized.

Furthermore, use of such heterogeneous junction allows to easily form a barrier capable of preventing the diffusion of positive holes in the direction of depth of the emitter area.

Furthermore, the depth of said emitter area is selected at least shorter than the diffusion length of the minority carriers injected from said base area, thereby effectively reducing a component of the base current, namely the current resulting from recombination of the electrons with the positive holes in the emitter area.

Furthermore said barrier constituting area is so formed as to surround said emitter and collector areas, and the distance from said emitter area to said barrier constituting interface is selected at least shorter than the diffusion length of the minority carriers injected from said emitter area, whereby the current resulting from recombination of the positive holes with the electrons can be drastically reduced.

Furthermore, the depth of said barrier constituting interface is selected shallower than the depth of said emitter and collector areas, thereby concentrating the emitter current in the vicinity of the surface of the substrate, in optimum manner for the lateral bipolar transistor in which the current flows laterally.

[Embodiment 1]

FIG. 1 illustrates a preferred first embodiment of the present invention.

A silicon substrate 1 is composed, in the present embodiment, of a p-substrate doped with a p-type impurity capable of controlling the conductive type in the p-type, such as boron (B).

An embedded area 2, doped with an impurity capable of controlling the conductive type, is doped in the present embodiment with an n-type impurity such as phosphor (P) with an impurity concentration of $10^{16}$–$10^{20}$ [cm$^{-3}$].

An n-area 3, constituting a part of the base area $B_R$, is for example formed by epitaxial growth with a low impurity concentration (for example $10^{14}$–$5 \times 10^{7}$ [cm$^{-3}$]).

An n-area 4, constituting a feature of the present invention, is composed of a mixed crystal $Si_{1-x}Ge_x$ with a narrower forbidden band than in Si, and constitutes the base area $B_R$.

P$^+$-areas 5, 5' are formed in said n-area 4 and respectively constitute an emitter area $E_R$ and a collector area $C_R$.

An n$^+$-area 6 connects said embedded area 2 with a metal base electrode 201, in order to reduce the base resistance of the lateral bipolar transistor.

An n-area 7 and a p-area 8 constitute channel stops.

There are also shown an oxide film 30, an element separating area 100, an insulating area 110 for separating electrodes, a metal base electrode 201, and a metal collector electrode 202.

FIGS. 2A and 2B schematically show the potential distribution of the semiconductor device shown in FIG. 1, respectively along lines A–A' and B–B' shown therein.

As shown in FIG. 2B, the potential distribution along the line B–B' in FIG. 1 is similar to that in the usual bipolar transistor, and the collector current $I_C$ can be easily calculated as it is determined by the concentration $N_B$ of the base area $B_R$ and the base width $W_B$. In the conventional lateral bipolar transistor, the emitter area and the collector area mutually face only in a very small area, while they are extended quite widely along the surface of the substrate. The collector current flows only through the mutually facing area of the emitter and the collector. On the other hand, the base current is principally governed by a current generated by the recombination of the positive holes, injected from the emitter area $E_R$ into the base area $B_R$ in the direction of depth of the substrate, with the electrons constituting the majority carriers, and a diffusion current contributed by the electrons injected from the base area into the emitter area, and becomes large because of a wide area involved. These facts pose limitation on the increase of the current amplification factor $h_{FE}$.

In the present invention, in order to prevent the diffusion of the positive holes, injected from the emitter area, into the direction of depth of the substrate, a heterogeneous interface is formed at a depth $I_B$, between the n-area 3 and the area 4. The potential distribution in the direction of depth is shown in FIG. 2A.

In the following are explained current components in the lateral bipolar transistor:

(I) Collector Current $I_C$

The collector current $I_C$ between the mutually opposed emitter and collector can be substantially determined by the following equation.

The magnitude of the emitter area opposed to the collector area in a horizontal bipolar transistor can be approximately represented by $T_E \cdot L$ wherein $T_E$ and $L$ are respectively the depth and length of the emitter.

$$I_C = \chi_E \cdot L \left( \frac{q \cdot D_p \cdot n_i}{L_B \cdot L_P} \right)^2 \text{cosech}\left( \frac{W_B}{L_P} \right) \left[ \exp\left( \frac{V_{BE}}{kT} \right) - 1 \right] \quad (1)$$

wherein q is elementary charge [C], $D_p$ is diffusion coefficient [cm$^2$/s] of positive holes, $L_p$ is diffusion length [cm] of positive holes, $n_i$ is true carrier density [cm$^{-3}$], $V_{BE}$ is emitter-base voltage, $W_B$ is base width [cm], $N_B$ is base impurity concentration [cm$^{-3}$], $Y_E$ is emitter depth, L is emitter length, k is Boltzman constant [J/K], and T is absolute temperature [°K].

(II) Base Current $I_B$

The base current $I_B$ is principally composed of three components shown in the following equations (2)–(4).

(a) Recombination current $I_{B1}$ generated in the base area $B_R$ by the positive holes flowing laterally from the emitter area $E_R$:

$$I_{B1} = \chi_E \cdot L \cdot \left( \frac{q \cdot D_p \cdot n_i}{N_B \cdot L_P} \right)^2 \cdot \frac{\cosh(W_B/L_B) - 1}{\sinh(W_B/L_P)} \cdot \left[ \exp\left( \frac{V_{BE}}{kT} \right) - 1 \right] \quad (2)$$

(b) Recombination current $I_{B2}$ generated by the positive holes flowing vertically from the emitter area $E_R$:

$$I_{B2} = (W_E \cdot L) \frac{q \cdot n_i^2 \cdot D_p}{N_B \cdot L_P} \cdot \tanh\left( \frac{\chi_B}{L_P} \right) \cdot \left[ \exp\left( \frac{V_{BE}}{kT} \right) - 1 \right] \quad (3)$$

wherein $Y_B$ is the distance in the direction of depth from the emitter area $E_R$, and $W_E$ is emitter width.

(c) Diffusion current $I_{B3}$ generated by the electrons flowing from the base area $B_R$ to the emitter area $E_R$:

$$I_{B3} = (W_E \cdot L) \frac{q \cdot n_i^2 \cdot D_n}{N_E \cdot L_n} \cdot \coth\left( \frac{\chi_E}{L_n} \right) \cdot \left[ \exp\left( \frac{V_{BE}}{kT} \right) - 1 \right] \quad (4)$$

wherein $N_E$ is impurity concentration in the emitter area $E_R$, $L_n$ is diffusion length of the electrons, and $D_n$ is diffusion coefficient of the electrons.

In the present invention, particularly considered is the base current component $I_{B2}$ represented by the equation (3).

In the conventional lateral bipolar transistor, most of the positive holes injected from the emitter area $E_B$ flows vertically and contributes to the base current by recombination. On the other hand, in the present invention, a potential barrier $\Delta\phi_B$ is formed at a distance $Y_B$ from the emitter area $E_R$ to stop the injected carriers.

The probability of passing through said barrier is represented by $\exp(-\Delta\phi_B/kT)$.

Said probability, for example at room temperature is $\Delta\phi_B = 0.1$ [eV], which is about 1/54 of that in the conventional lateral bipolar transistor.

If $Y_B \ll L_p$, in the equation (3), since $\tanh(Y_B/L_P) \cong Y_B/L_P$, $I_{B2}$ in the lateral bipolar transistor of the present invention becomes significantly lower than that in the conventional one.

In the following there will be explained the diffusion length $L_p$ of positive holes in the n-area.

Following equation stands for the mobility $\mu_p$ of positive holes, over a wide range of the n-impurity concentration $N_D$:

$$\mu_P = \frac{370}{1 + (N_D/8 \times 10^{17})^{1.25}} + 130 [cm^2/V \cdot sec] \quad (5)$$

As will be understood from this equation (5), the mobility $\mu_p$ approaches to a constant value 500[cm²/V·sec] when the impurity concentration $N_D$ becomes smaller, but becomes a function of said concentration $N_D$ when it exceeds $10^{17}$[cm⁻³].

On the other hand, the life $\tau_p$ of the minority carriers is represented by the following equation when the impurity concentration exceeds $10^{17}$[cm⁻³]:

$$\frac{1}{\tau_p} = 7.8 \times 10^{-13} N_D + 1.8 \times 10^{-31} N_D^2 [sec^{-1}] \quad (6)$$

Based on said mobility $\mu_p$ and life $\tau_p$, the diffusion length $L_p$ of positive holes is generally represented by:

$$L_p = \sqrt{\frac{kT}{q} \cdot \mu_p \cdot \tau_p} \quad (7)$$

FIG. 3 illustrates the mobility $\mu_p$ (curve $F_3$), life $\tau_p$ (curve $F_1$) and diffusion length $L_p$ (curve $F_2$) of positive holes, constituting the minority carriers in n-type silicon, as calculated from the foregoing equations (5), (6) and (7) in a range of $N_D$ of $10^{17}$–$10^{19}$[cm⁻³].

As will be apparent from FIG. 3, the diffusion length of positive holes is extremely long and amounts to 120[μm] at $N_D=10^{17}$ [cm⁻³]. It is still about 30[μm] even at $N_D=10^{18}$ [cm⁻³].

In a lateral bipolar transistor of pnp type formed on a same substrate together with a usual vertical bipolar transistor of npn type, the impurity concentration of the base area becomes same as that of the collector area of said vertical bipolar transistor of npn type and is as low as $10^{14}$–$5 \times 10^{17}$ [cm⁻³], so that the relation $Y_B \ll L_p$ can be easily obtained. However a condition of about $Y_B \leq L_p/10$ is desirable.

Under such condition, said recombination current $I_{B2}$ is drastically reduced so that the base current $I_B$ is principally governed by $I_{B1}$ and $I_{B3}$ and the current amplification factor $h_{FE}$ can be made close to that of the vertical bipolar transistor. In case of mixed crystal $Si_{1-x}Ge_x$, the mobility of the carriers is reduced due to the alloy effect, but, in a high impurity concentration region (for example $10^{18}$[cm⁻³] or higher) the impurity effect becomes predominant and the mixed crystal and Si single crystal behave almost in the same manner.

When said recombination current $I_{B2}$ is decreased, as the components of the base current satisfy a relation $I_{B3} \ll I_{B1}$, an increase in the current amplification factor $h_{FE}$ of the lateral bipolar transistor can be achieved, if $W_E \ll L_p$, by increasing the following ratio:

$$\frac{I_C}{I_{B3}} \approx \frac{\chi_E}{W_E} \cdot \frac{D_p}{D_n} \cdot \frac{L_n}{L_p} \cdot \frac{N_E}{N_B} \quad (8)$$

In designing, $Y_E/W_E$ and $N_E/N_B$ can be easily made larger in said equation (8). A larger value of $N_E/N_B$ is the same as in the usual vertical bipolar transistor, but a larger value of $Y_E/W_E$ is specific to the lateral bipolar transistor.

In the following there will be explained an example of the manufacturing process of the device of the first embodiment shown in FIG. 1:

(1) On a p-type Si substrate 1, an n⁺-embedded area 2 with an impurity concentration for example of $10^{15}$–$10^{19}$[cm⁻³] was formed by implantation (or diffusion) of at least an element selected from the elements of group V, such as As, Sb, P etc.

(2) An n-area 3 with an impurity concentration for example of $10^{14}$–$10^{17}$[cm⁻³] was formed for example by epitaxial growth.

(3) An n⁺-area 6 (with an impurity concentration for example of $10^{17}$–$10^{20}$[cm⁻³]) was formed for reducing the base resistance.

(4) An insulating film 100 for element separation was formed by selective oxidation or CVD, and a channel stop area 7 was formed under said insulating film 100.

(5) Ge ions were selectively implanted into the Si substrate 1 for example with an impurity concentration of $1 \times 10^{16}$–$1 \times 10^{17}$[cm⁻²], and a heat treatment was conducted to form an n-area 4 consisting of $Si_{1-x}Ge_x$.

(6) B⁺ions were implanted with a concentration of $1 \times 10^{15}$ [cm⁻²], and a heat treatment was conducted to form P⁺-areas 5, 5' constituting the emitter and the collector.

(7) An insulation film 110 was deposited and annealed, and contact holes were opened.

(8) Al-Si (1%) for forming the electrodes 200, 201, 202 was deposited by sputtering and was subsequently patterned.

(9) The alloy formation of said Al-Si electrodes was conducted for example for 30 minutes at 450° C., and a passivation film was formed.

The semiconductor device of the first embodiment was prepared through the above-explained procedure.

Figure 4:
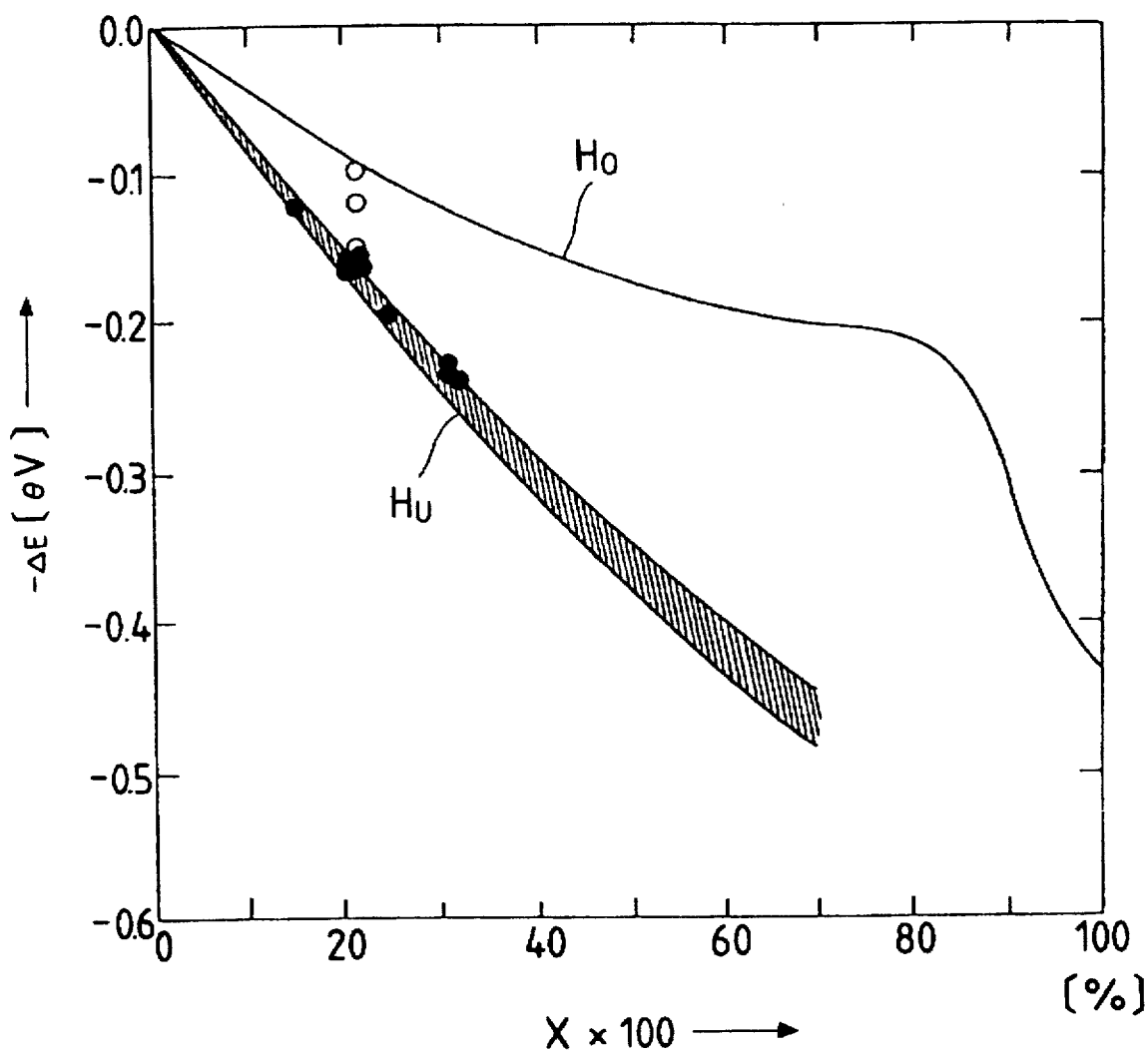
FIG. 4 is a chart showing the change in the band gap as a function of mixed crystal ratio in $Si_{1-x}Ge_x$.

FIG. 4 shows the change in the band gap of the mixed crystal $Si_{1-x}Ge_x$, wherein the abscissa indicates the mixed crystal ratio of Ge (X·100%) whereas the ordinate indicates decrease $-\Delta E$ in the band gap in comparison with the Si single crystal. A curve $H_O$ indicates a distortion-free state whereas a curve $H_U$ indicates a distorted state, which is selected in a semiconductor device.

As shown in FIG. 4, a band gap decrease $-\Delta E \cong 0.1$[eV] corresponds approximately to a mixed amount X=0.12, and a barrier of 0.1[eV] is formed in this state.

When Ge ions were implanted with a concentration $1 \times 10^{16}$[cm⁻²] and with an accelerating voltage 150[keV], the peak concentration is about $1 \times 10^{20}$[cm⁻³]. Since the density of monocrystalline Si is $5 \times 10^{23}$[cm⁻³], the mixed amount of Ge becomes about 2%. X=0.12 can be attained for example with a Ge concentration of $6 \times 10^{16}$[cm⁻³].

[Embodiment 2]

Figure 5:
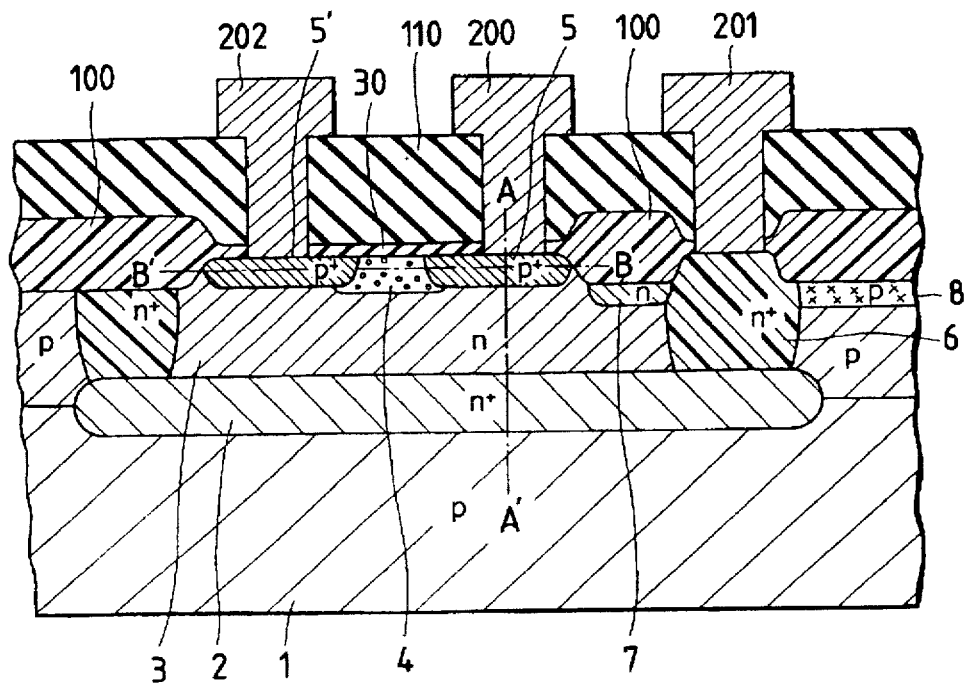
FIG. 5 is a schematic cross-sectional view of a second embodiment.

FIG. 5 illustrates a 2nd embodiment, wherein the n-area 4 consisting of mixed crystal $Si_{1-x}Ge_x$ is limited to a smaller area than in the 1st embodiment. Thus the depth of said n-area 4 is comparable to that of the P⁺emitter and collector areas 5, 5'.

The present invention utilizes a phenomenon that the p-n injection efficiency varies in the p-n junction between the n-area 4 and the p⁺-area 5 because of a smaller band gap in comparison with the p-n junction between the p⁺-area 5 and the n-area 3.

The present 2nd embodiment is different from the 1st embodiment in that the hole recombination current $I_{B2}$ is given by multiplying the equation (3) with a factor $\exp(-\Delta E/kT)$, and that the diffusion current $I_{B3}$ is also given by multiplying the equation (4) with a factor $\exp(-\Delta E/kT)$. An increase in the current amplification factor $h_{FE}$ is attained by these features.

What is essentially important in the present embodiment is the confinement of the collector current in the vicinity of the surface, and, for this reason, the area 4 may be made shallower than the areas 5, 5'.

Other structures and functions are the same as those in the foregoing 1st embodiment, and will not, therefore, be explained further.

[Embodiment 3]

Figure 6:
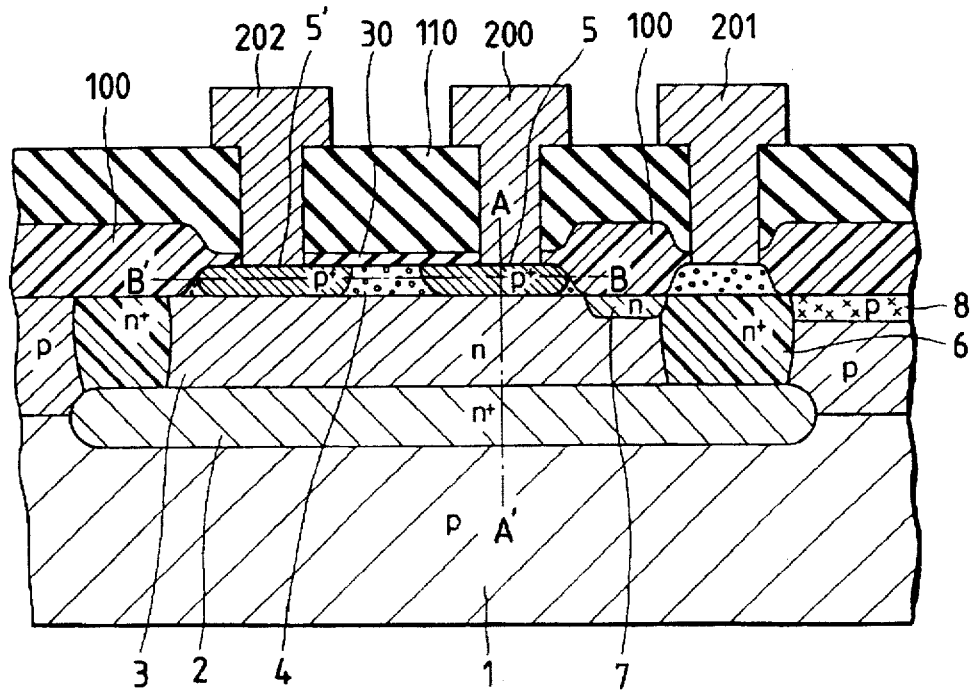
FIG. 6 is a schematic cross-sectional view of a third embodiment.

FIG. 6 illustrates a 3rd embodiment.

In the present embodiment, the n-area 4 consisting of mixed crystal $Si_{1-x}Ge_x$ is not formed by ion implantation but by epitaxial growth, and $p^+$-areas 5, 5' constituting the emitter and collector areas are subsequently formed therein. In this case the contact of the base area is also formed by mixed crystal, but this is not critical. Also the area 4 may be formed shallower than the areas 5, 5' as long as the collector current can be confined in the area 4 by the difference in the b and gap.

Also in the foregoing 1st and 2nd embodiments, the contact of the base area may be composed of Si—Ge mixed crystal, and the contact resistances of the areas can be similarly reduced.

[Embodiment 4]

FIG. 7 illustrates a 4th embodiment of the present invention.

A silicon substrate 1 is composed, in the present embodiment, of a p-substrate doped with a p-type impurity capable of controlling the conductive type in the p-type, such as boron (B).

An embedded area 2, doped with an impurity capable of controlling the conductive type, is doped in the present embodiment with an n-type impurity such as phosphor (P) with an impurity concentration of $10^{16}-10^{20}[cm^{-3}]$.

An n-area 3, constituting a part of the base area $B_R$, is for example formed by epitaxial growth with a low impurity concentration (for example $10^{14}-5\times10^{17}[cm^{-3}]$).

An n-area 4, constituting a feature of the present invention, is composed of a mixed crystal $Si_{1-x}Ge_x$ with a narrow forbidden band, and constitutes the base area $B_R$.

$P^+$-areas 5, 5' are formed in said n-area 4 and respectively constitute an emitter area $E_R$ and a collector area $C_R$.

An $n^+$-area 6 connects said embedded area 2 with a metal base electrode 201, in order to reduce the base resistance of the lateral bipolar transistor.

An n-area 7 and a p-area 8 constitute channel stops.

Semiconductor layers 730, 731 are composed of polycrystalline p-silicon doped with boron (B) at a high concentration (for example $10^{18}-10^{20}[cm^{-3}]$).

There are further shown an element separating area 100, an electrode separating insulating area 110, a metal base electrode 201, and a metal collector electrode 202.

FIGS. 8A and 8B schematically show the potential distribution of the semiconductor device shown in FIG. 7, respectively along lines A–A' and B–B' shown therein.

As shown in FIG. 8B, the potential distribution along the line B–B' in FIG. 7 is similar to that in the usual bipolar transistor, and the collector current $I_C$ can be easily calculated as it is determined by the concentration $N_B$ of the base area $B_R$ and the base width $W_B$. In the conventional lateral bipolar transistor, the emitter area and the collector area mutually face only in a very small area, while they are extended quite widely along the surface of the substrate. The collector current flows only through the mutually facing area of the emitter and collector. On the other hand, the base current is principally governed by a current generated by the recombination of the positive holes, injected from the emitter area $E_R$ into the base area $B_R$ in the direction of depth of the substrate, with the electrons constituting the majority carriers, and a diffusion current contributed by the electrons injected from the base area into the emitter area, and becomes large because of a wide area involved. These facts pose limitation on the increase of the current amplification factor $h_{FE}$.

In the present embodiment, therefore, a heterogeneous interface is formed at a depth $Y_B$ from the emitter, and a semiconductor layer 730 of a wider forbidden band than in the emitter is formed thereon. The potential distribution in the direction of depth is shown in FIG. 8A.

In the following the current components in the lateral bipolar transistor will be explained, though the explanation may partly overlap with the foregoing description.

(I) Collector Current $I_C$

The collector current $I_C$ between the mutually opposed emitter and collector can be substantially determined by the following equation.

The magnitude of the emitter area opposed to the collector area in a lateral bipolar transistor can be approximately represented by $Y_E \cdot L$ wherein $T_E$ and $L$ are respectively the depth and length of the emitter.

$$I_C = \chi_E \cdot L \left( \frac{q \cdot D_p \cdot n_i}{L_B \cdot L_P} \right)^2 \operatorname{cosech}\left( \frac{W_B}{L_P} \right) \left[ \exp\left( \frac{V_{BE}}{kT} \right) - 1 \right] \quad (1)$$

wherein q is elementary change [C], $D_p$ is diffusion coefficient $[cm^2/s]$ of positive holes, $L_p$ is diffusion length [cm] of positive holes, $n_i$ is true carrier density $[cm^{-3}]$, $V_{BE}$ is emitter-base voltage, $W_B$ is base width [cm], $N_B$ is base impurity concentration $[cm^{-3}]$, $Y_E$ is emitter depth, L is emitter length, k is Boltzman constant [J/K], and T is absolute temperature [°K].

(II) Base Current $I_B$

The base current $I_B$ is principally composed of three components shown in the following equations (2)–(4).

(a) Recombination circuit $I_{B1}$ generated in the base area $B_R$ by the positive holes flowing laterally from the emitter area $E_R$:

$$I_{B1} = \chi_E \cdot L \cdot \left( \frac{q \cdot D_p \cdot n_i^2}{N_B \cdot L_P} \right) \cdot \quad (2)$$

$$\frac{\cosh(W_B/L_B)-1}{\sinh(W_B/L_P)} \cdot \left[ \exp\left( \frac{V_{BE}}{kT} \right) - 1 \right]$$

(b) Recombination current $I_{B2}$ generated by the positive holes flowing vertically from the emitter area $E_R$:

$$I_{B2} = (W_E \cdot L) \frac{q \cdot n_i^2 \cdot D_p}{N_B \cdot L_P} \cdot \tanh\left( \frac{\chi_B}{L_P} \right) \cdot \left[ \exp\left( \frac{V_{BE}}{kT} \right) - 1 \right] \quad (3)$$

wherein $Y_B$ is the distance in the direction of depth from the emitter area $E_R$, and $W_E$ is emitter width.

(c) Difussion current $I_{B3}$ generated by the electrons flowing from the base area $B_R$ to the emitter area $E_R$:

$$I_{B3} = (W_E \cdot L) \frac{q \cdot n_i^2 \cdot D_n}{N_E \cdot L_n} \cdot \tanh\left( \frac{\chi_E}{L_n} \right) \cdot \left[ \exp\left( \frac{V_{BE}}{kT} \right) - 1 \right] \quad (9)$$

wherein $N_E$ is impurity concentration in the emitter area $E_R$, $L_n$ is diffusion length of the electrons, and $D_n$ is diffusion coefficient of the electrons.

In the present invention, particular attention is paid to the base current component $I_{B2}$ represented by the equation (3), and $I_{BB}$ represented by (9).

In the conventional lateral bipolar transistor, most of the positive holes injected from the emitter area $E_B$ flows vertically and contributes to the base current by recombination. On the other hand, in the present invention, a potential barrier $\Delta\phi_B$ is formed at a distance $Y_B$ from the emitter area $E_R$ to stop the injected carriers.

The probability of passing through said barrier is represented by exp $(-\Delta\phi_B/kT)$, as already explained before.

Said probability, for example at room temperature is $\Delta\phi_B=0.1[eV]$, which is about 1/54 of that in the conventional lateral bipolar transistor.

If $Y_B \ll L_P$ in the equation (3), since tanh $(Y_B/L_P) \cong Y_B/L_P$, $I_{B2}$ in the lateral bipolar transistor of the present invention becomes significantly lower than that in the conventional one.

In the following there will be explained the diffusion length $L_P$ of positive holes in the n-area.

Following equation stands for the mobility $\mu_P$ of positive holes, over a wide range of the n-impurity concentration $N_D$:

$$\mu_P = \frac{370}{1+(N_D/8 \times 10^{17})^{1.25}} + 130 [cm^2/V \cdot sec] \quad (5)$$

As will be understood from this equation (5), the mobility $\mu_P$ approaches to a constant value 500 $[cm^2/V \cdot sec]$ when the impurity concentration $N_D$ becomes smaller, but becomes a function of said concentration $N_D$ when it exceeds $10^{17}[cm^{-3}]$.

On the other hand, the life $\tau_p$ of the minority carriers is represented by the following equation when the impurity concentration exceeds $10^{17}[cm^{-3}]$:

$$\frac{1}{\tau_p} = 7.8 \times 10^{-13}N_D + 1.8 \times 10^{-31}N_D^2 [sec^{-1}] \quad (6)$$

Based on said mobility $\mu_p$ and life $\tau_p$, the diffusion length $L_p$ of positive holes is generally represented by:

$$L_p = \sqrt{\frac{kT}{q} \cdot \mu_p \cdot \tau_p} \quad (7)$$

As will be apparent from FIG. 3, the diffusion length of positive holes is extremely long and amounts to 120[μm] at $N_D=10^{17}[cm^{-3}]$. It is still about 30[μm] even at $N_D=10^{18}[cm^{-3}]$.

In a lateral bipolar transistor of pnp type formed on a same substrate together with a usual vertical bipolar transistor of npn type, the impurity concentration of the base area becomes the same as that of the collector area of said vertical bipolar transistor of npn type and is as low as $10^{14}-5\times10^{17}[cm^{-3}]$, so that the relation $Y_B \ll L_p$ can be easily obtained. However a condition of about $Y_B \leq L_p/10$ is desirable.

Under such condition, said recombination current $I_{B2}$ is drastically reduced, so that the base current $I_B$ is principally governed by $I_{B1}$ and $I_{B3}$, and the current amplification factor $h_{FE}$ can be made close to that of the vertical bipolar transistor.

With the decrease of said recombination current $I_{B2}$, the base current $I_B$ is predominantly governed by the recombination current $I_{B1}$ and the diffusion current $I_{B3}$, whereas in the conventional lateral bipolar transistor, it is predominantly governed by a current generated by the recombination of the minority carriers diffused from the emitter in the direction of depth, and the diffusion current $I_{B3}$.

Thus, according to the present embodiment, above the emitter area there is provided a semiconductive polycrystalline Si layer 730 having a wider forbidden band than in said emitter area, as shown in FIG. 8A, in order to prevent the diffusion of electrons.

In the conventional lateral bipolar transistor, said diffusion current $I_{B3}$ is considerably large, because a metal electrode is formed directly above the emitter area 5.

When the electrons are injected from the base area into the emitter area under a condition $Y_B \ll L_N$ the diffusion current $I_{B3}$ is proportional to $Y_B/L_n^2$ as will be understood from the equation (4), but, in the conventional lateral bipolar transistor, it is proportional to $1/Y_E^2$. Thus $I_{B3}$ in the lateral bipolar transistor of the present invention is smaller, by a ratio $Y_E^2/L_n^2$ than that in the conventional lateral bipolar transistor.

Then there will be explained the diffusion length of electrons in the $p^+$-area 5.

Following relation stands on the mobility $\mu_n$ of electrons, over a wide range of the concentration Na of p-impurity:

$$\mu_n = 232 + \frac{1180}{1+(Na/8 \times 10^{16})^{0.9}} [cm^2/V \cdot sec] \quad (10)$$

Consequently the mobility $\mu_n$ approaches to 1412 $[cm^2/V \cdot sec]$ for a lower impurity concentration Na, and becomes equal to 232$[cm^2/V \cdot sec]$ for an infinite impurity concentration Na.

On the other hand, the life $\tau_n$ of the minority carriers is represented by the following equation for an impurity concentration equal to or larger than $10^{17}[cm^{-3}]$:

$$\frac{1}{\tau_n} = (3.45 \times 10^{-12}Na) + (9.5 \times 10^{-32}Na^2) sec^{-1} \quad (11)$$

Based on said mobility $\mu_n$ and life $\tau_n$ the diffusion length $L_n$ is generally represented by:

$$L_n = \sqrt{\frac{kT}{q} \cdot \mu_n \cdot \tau_n} \quad (12)$$

Figure 9:
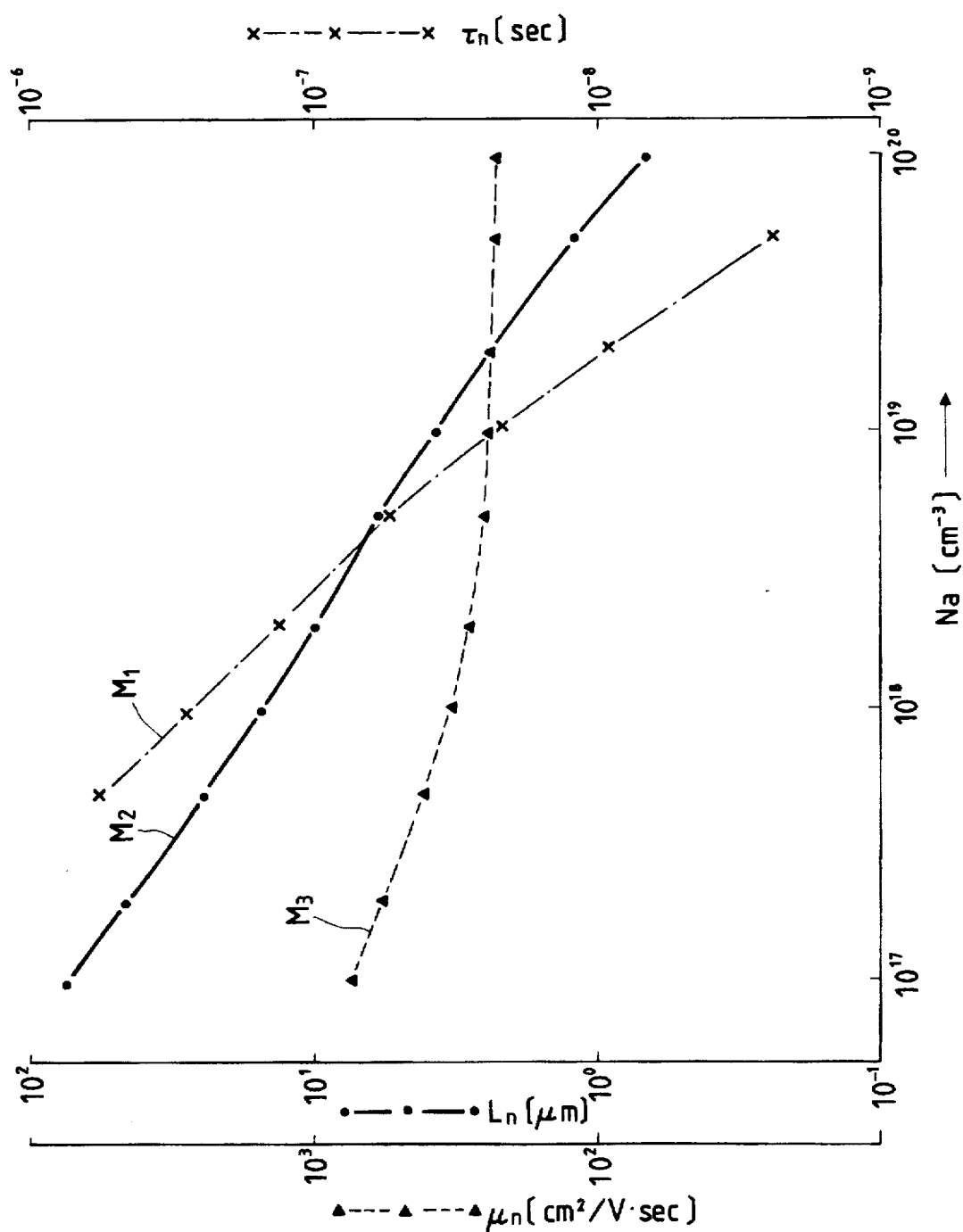
FIG. 9 is a chart showing the mobility life and diffusion length of electrons as a function of concentration of p-type inpurity.

FIG. 9 shows the mobility $\mu_n$ (curve $M_3$), life $\tau_n$ (curve $M_1$) and diffusion length $L_n$ (curve $M_2$) of the electrons, calculated by the equations (10), (11) and (12) in a range of the p-impurity concentration Na of $10^{17}-10^{20}[cm^{-3}]$.

Following fact will be understood from FIG. 9. The p-emitter area of the lateral bipolar transistor is usually common with the base area of the vertical bipolar transistor and has therefore an impurity concentration not exceeding $10^{18}[cm^{-3}]$, and the diffusion length becomes as large as 15–70[μm] in such state. Consequently the diffusion current $I_{B3}$ in the emitter area can be sufficiently lowered if the emitter depth $Y_E$ is about $L_n/5$ or less.

$Si_{1-x}Ge_x$ constituting said n-area 4 shows a small carrier mobility due to the alloy effect, but, under a high impurity concentration for example equal to or higher than $10^{18}[cm^{-3}]$, it behaves like Si because the carrier effect by the impurities becomes predominant.

In the structure of the present embodiment, as explained in the foregoing, the base current approaches to the value of the recombination current $I_{B1}$, and the current amplification factor $h_{FE}$ approaches to that of the vertical heterogeneous bipolar transistor. The current amplification factor in such state, if a condition $W_B \ll L_p$ is satisfied, can be represented by:

$$h_{FE} \equiv \frac{Ic}{I_{B1}} \cong 2\left(\frac{L_p}{W_B}\right)^2 \quad (13)$$

As explained in the foregoing, the present embodiment is designed to block the positive holes, injected from the $p^+$-emitter area 5, by the heterogeneous interface between the n-area 4 and the n-area 3 consisting of mixed crystal, thereby preventing the diffusion of said positive holes into the deeper area of the substrate, and to prevent the diffusion of electrons, injected into the emitter area, by the potential barrier formed at the heterogeneous interface between the Si—Ge mixed crystal and the monocrystalline silicon.

In the following there will be explained an example of the manufacturing process of the device of the 4th embodiment shown in FIG. 7:

(1) On a p-type Si substrate 1, an n+embedded area 2 with an impurity concentration for example of $10^{15}$–$10^{19}$[cm$^{-3}$] was formed by implantation (or diffusion) of at least an element selected from the elements of group V, such as As, Sb, P etc.

(2) An n-area 3 with an impurity concentration for example of $10^{14}$–$10^{17}$[cm$^{-3}$] was formed for example by epitaxial growth.

(3) An n+-area 6 (with an impurity concentration for example of $10^{17}$–$10^{20}$[cm$^{-3}$]) was formed for reducing the base resistance.

(4) An insulating film 100 for element separation was formed by selective oxidation or CVD, and a channel stop area 7 was formed under said insulating film 100.

(5) Ge ions were selectively implanted into the Si substrate 1 for example with an impurity concentration of $1 \times 10^{16}$–$1 \times 10^{17}$[cm$^{-2}$], and a heat treatment was conducted to form an n-area 4 consisting of $Si_{1-x}Ge_x$.

(6) B+ions were implanted with a concentration of $1 \times 10^{15}$ [cm$^{-2}$], and a heat treatment was conducted to form p+-areas 5, 5' constituting the emitter and the collector.

(7) Semiconductor layers 730, 731 consisting of polycrystalline silicon were deposited for example with a thickness of 4000 Å, then subjected to boron ion implantation with a concentration of $1 \times 10^{16}$[cm$^{-2}$], further subjected to a heat treatment at 800°–900° C. and were patterned. In case of monocrystalline silicon, epitaxial growth was conducted for example at about 800° C.

(8) An insulation film 110 was deposited and annealed, and contact holes were opened.

(9) Al—Si (1%) for forming the electrodes 200, 201, 202 was deposited by sputtering and was subsequently patterned.

(10) The alloy formation of said Al—Si electrodes was conducted for example for 30 minutes at 450° C. and a passivation film was formed.

The semiconductor device of the 4th embodiment was prepared through the above-explained procedure.

[Embodiment 5]

Figure 10:
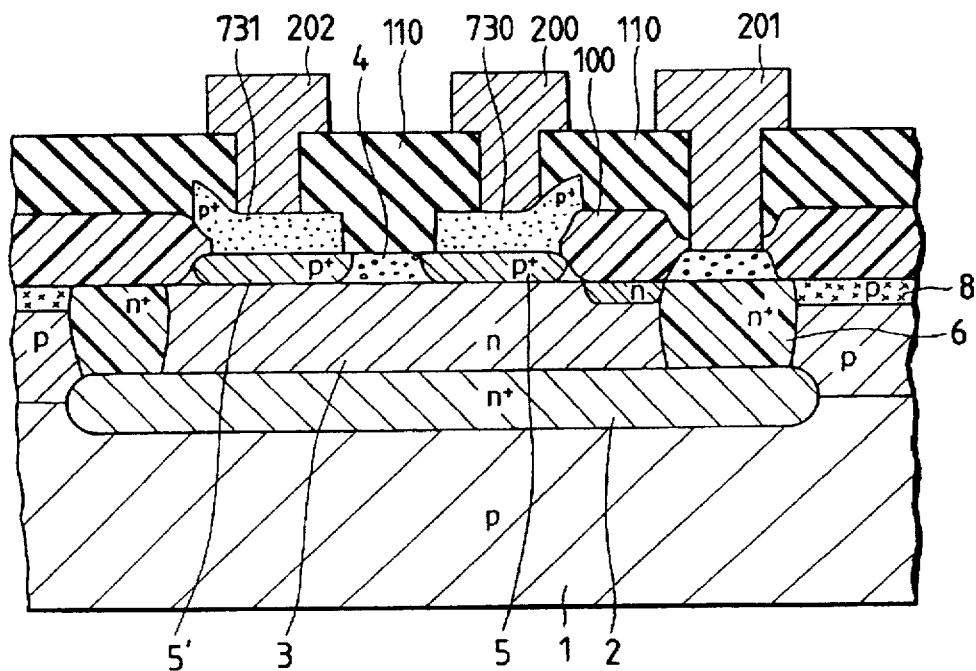
FIG. 10 is a schematic cross-sectional view of a fifth embodiment.

FIG. 10 illustrates a 5th embodiment.

In the present embodiment, the n-area 4 consisting of $Si_{1-x}Ge_x$ is epitaxially grown instead of ion implantation, and p+-areas 5, 5' constituting the emitter and the collector are subsequently formed therein. In this case the contact of the base area is also formed by Si—Ge.

Also in the foregoing 4th embodiment, the contact of the base area may naturally be formed with Si—Ge mixed crystal, in order to reduce the contact resistance.

Though the foregoing explanation has been limited to a lateral bipolar transistor of pnp type, the present invention is naturally applicable also to a lateral bipolar transistor of npn type. Furthermore a heterogeneous junction consisting of mixed crystals of other materials may be similarly employed. For example Si and Si—Ge may be respectively replaced by GaAs and GaAlAs, or by InP and InGaPAs.

Other structures and functions are the same as those in the 4th embodiment and will not, therefore, be explained further.

[Embodiment 6]

Figure 11:
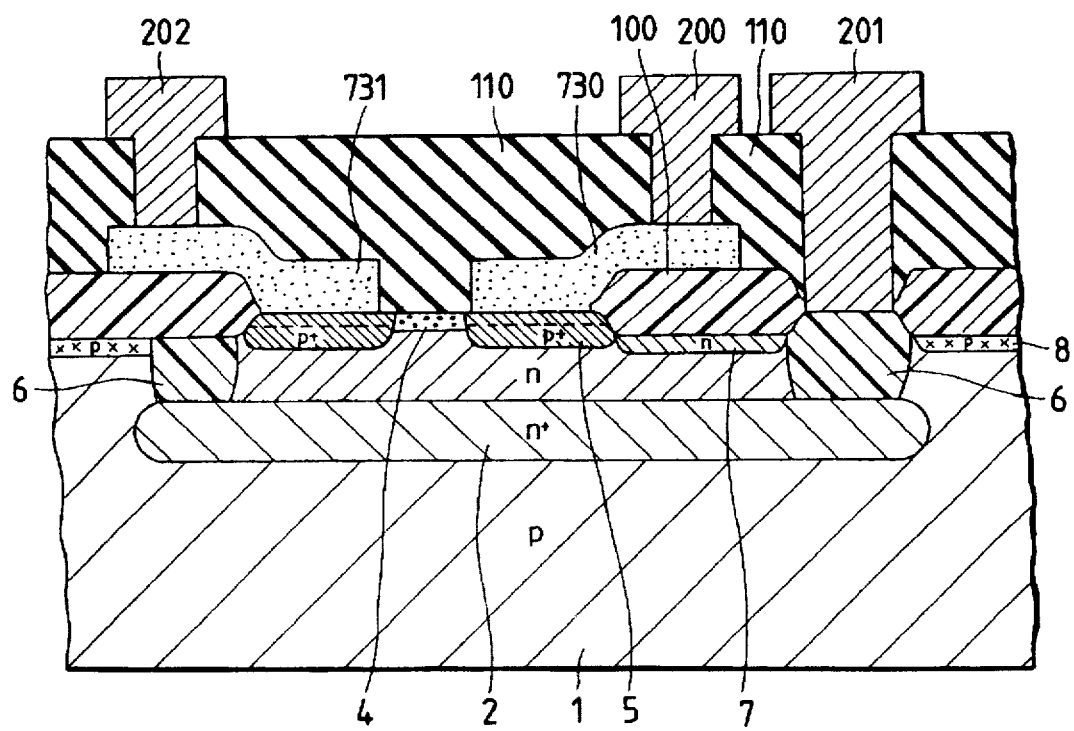
FIG. 11 is a schematic cross-sectional view of a sixth embodiment.

FIG. 11 illustrates a 6th embodiment.

In the present embodiment, the n-area 4 consisting of $Si_{1-x}Ge_x$ is formed in a shallower area than in the foregoing first embodiment. Thus the base depth $Y_B$ is a negative value, and the mixed crystal $Si_{1-x}Ge_x$ is formed shallower than the emitter and collector areas.

The p-n junction between the n-area 4 and the p+-area 5 is formed in Si—Ge, but other p-n junctions are formed in Si. Since the band gap in Si—Ge is smaller than in Si, the current at a same voltage is larger in the p-n junction of Si—Ge mixed crystal, by exp($\Delta E/kT$) times, than that of monocrystalline Si, and the difference is about 55 times at room temperature where $\Delta E$=0.1[eV].

The present embodiment achieves effective function of the lateral bipolar transistor by concentrating the emitter current in the vicinity of the surface of the substrate.

The areas 730, 731 may be formed not only with Si but also with a polycrystalline material such as SiC, or microcrystalline Si, or a compound semiconductor such as GaAs or GaAlAs.

Other structures and functions of the present embodiment are same as those in the 4th embodiment and will not, therefore, be explained further.

[Embodiment 7]

Figure 12:
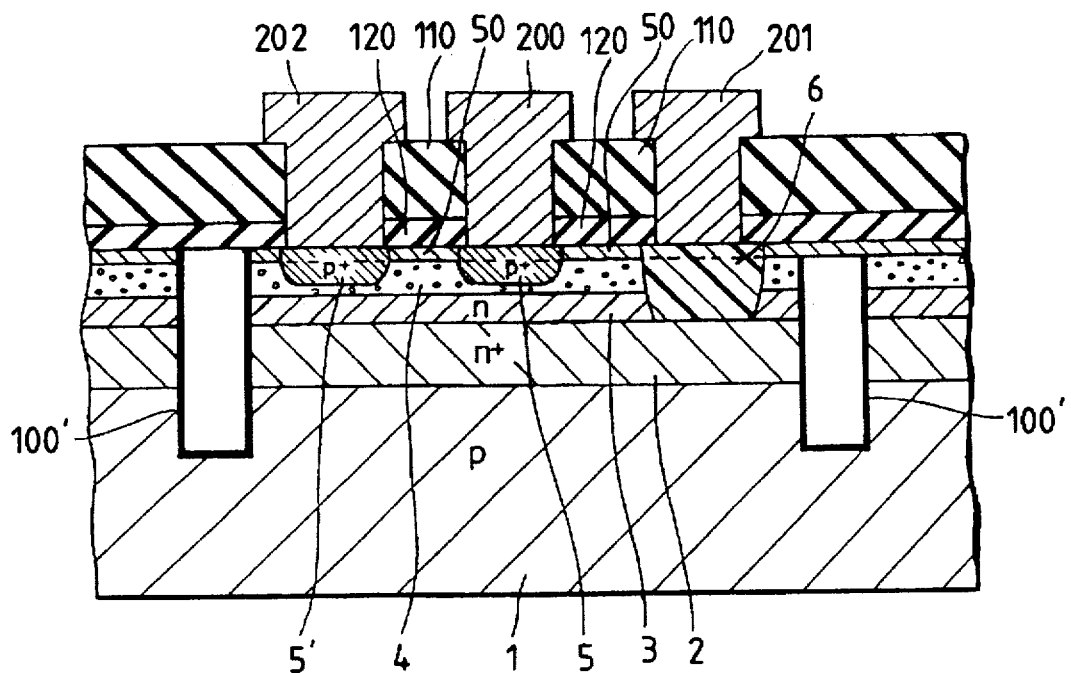
FIG. 12 is a schematic cross-sectional view of a seventh embodiment.

FIG. 12 illustrates a 7th embodiment.

The present embodiment is most characterized by the presence of an n-Si layer 50 on the n-area 4 consisting of $Si_{1-x}Ge_x$. In the foregoing 1st to 3rd embodiments, the contact electrode and the heterogeneous junctions are used in common, but, in the present embodiment, the n-areas 3, 4 and said n-Si layer 50 are continuously formed by epitaxy.

Also the element separating area 100 has a groove structure and mutually separates the n-areas 2, 3, 4 and 5. 120 indicates an oxide film.

Other structures and functions are the same as those in the foregoing 4th embodiment, and will not, therefore, be explained further.

[Embodiment 8]

Figure 13:
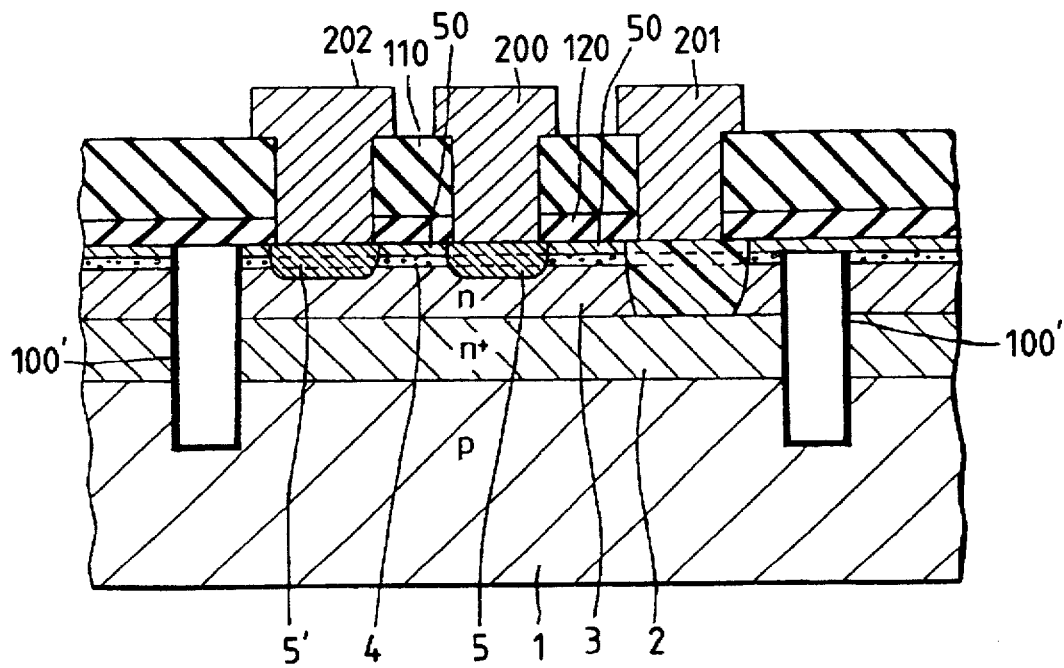
FIG. 13 is a schematic cross-sectional view of an eighth embodiment.

FIG. 13 illustrates an 8th embodiment, wherein the p+ emitter and collector areas 5, 5' are formed deeper than the n-area 4. Such structure allows to confine the collector current of the lateral bipolar transistor within the n-area 4 consisting of Si—Ge mixed crystal, solely by the difference in the band gap, thereby improving the current amplification factor $h_{FE}$ of such transistor.

Other structures and functions of the present embodiment are the same as those of the foregoing 7th embodiment and will not, therefore, be explained further.

In the embodiments shown in FIGS. 12 and 13, the contact electrodes 200, 201, 202 are composed of metal, but they may be formed with polycrystalline silicon.

[Embodiment 9]

Figure 14:
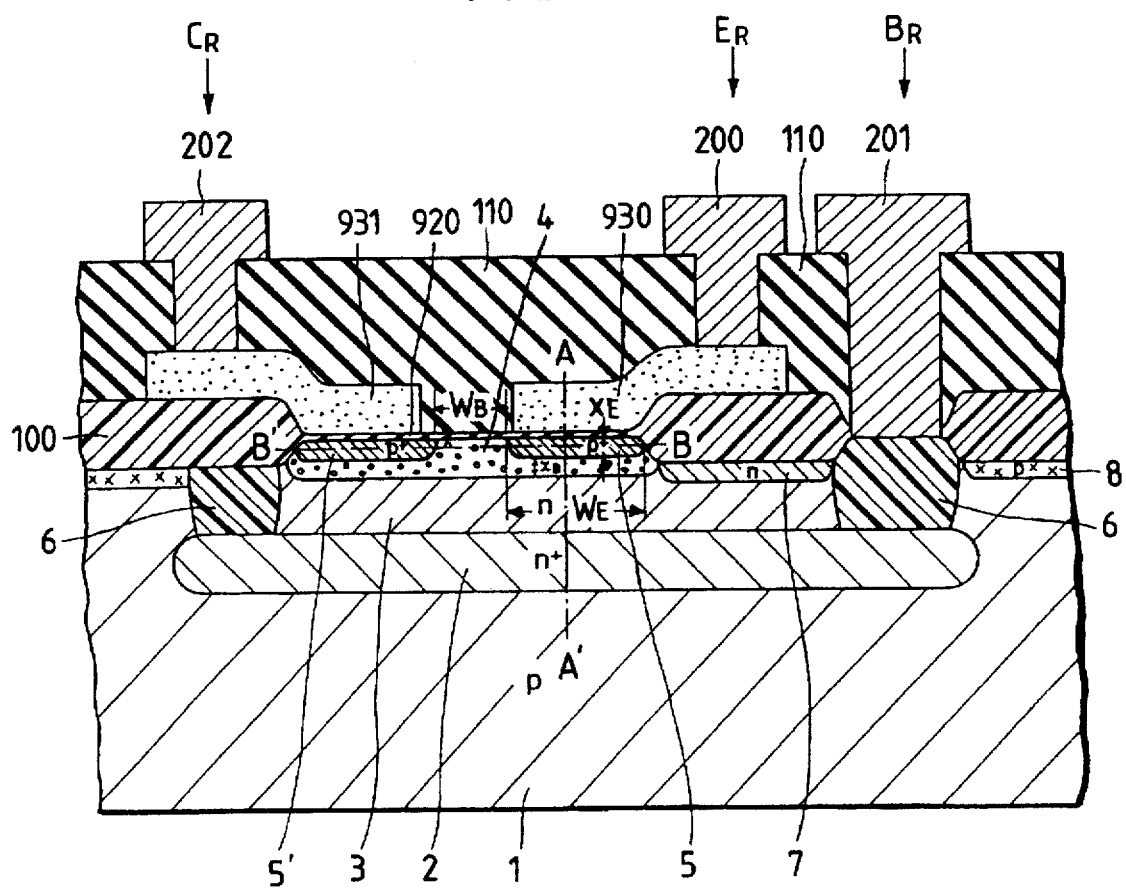
FIG. 14 is a schematic cross-sectional view of a ninth embodiment.

FIG. 14 illustrates a 9th embodiment of the present invention.

A silicon substrate 1 is composed, also in the present embodiment, of a p-substrate doped with a p-type impurity capable of controlling the conductive type in the p-type, such as boron (B).

An embedded area 2, doped with an impurity capable of controlling the conductive type, is doped in the present embodiment with an n-type impurity such as phosphor (P) with an impurity concentration of $10^{16}$–$10^{20}$[cm$^{-3}$].

An n-area 3, constituting a part of the base area $B_R$, is for example formed by epitaxial growth with a low impurity concentration (for example $10^{14}$–$5 \times 10^{17}$[cm$^{-3}$]).

An n-area 4, constituting a feature of the present invention, is composed of a mixed crystal $Si_{1-x}Ge_x$ with a narrow forbidden band, and constitutes the base area $B_R$.

$P^+$-areas 5, 5' are formed in said n-area 4 and respectively constitute an emitter area $E_R$ and a collector area $C_R$.

An $n^+$-area 6 connects said embedded area 2 with a metal base electrode 201, in order to reduce the base resistance of the lateral bipolar transistor.

An n-area 7 and a p-area 8 constitute channel stops.

An ultra thin tunnel oxide film 920 (for example of a thickness not exceeding 20 Å) serves to pass both the electrons and the positive holes by tunnel effect.

Polycrystalline semiconductive layers 930, 931 are composed of polycrystalline silicon doped with boron (B) at a high concentration (for example $10^{18}$–$10^{20}$[$cm^{-3}$]).

There are further shown an element separating area 100, an electrode separating insulating area 110, a metal base electrode 201, and a metal collector electrode 202.

Figure 15A:
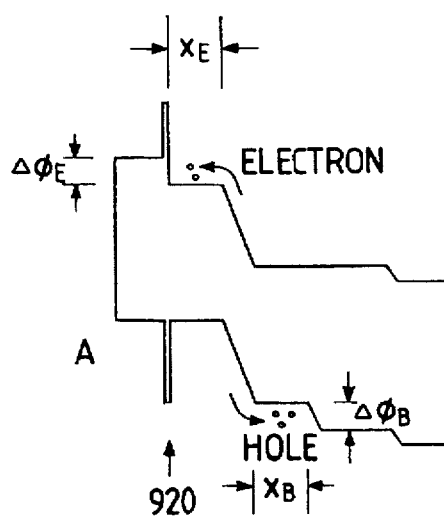
FIG. 15A is a schematic view showing the potential distribution along a line A–A' in FIG. 14.
Figure 15B:
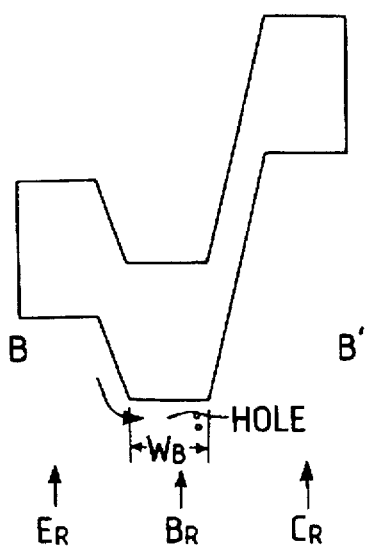
FIG. 15B is a schematic view showing the potential distribution along a line B–B' in FIG. 14.

FIGS. 15A and 15B schematically show the potential distribution of the semiconductor device shown in FIG. 14, respectively along lines A–A' and B–B' shown therein.

As shown in FIG. 15B, the potential distribution along the line B–B' in FIG. 14 is similar to that in the usual bipolar transistor, and the collector current $I_C$ can be easily calculated as it is determined by the concentration $N_B$ of the base area $B_R$ and the base width $W_B$. In the conventional lateral bipolar transistor, the emitter area and the collector area mutually face only in a very small area, while they are extended quite widely along the surface of the substrate. Consequently a current generated by the positive holes injected from the emitter area $E_R$ into the base area $B_R$ along the direction of depth of substrate and a diffusion current generated by the electrons flowing from the base area to the emitter area predominantly govern the function, and a limitation is posed on the increase of the current amplification factor $h_{FE}$.

In the present embodiment, therefore, a barrier $\Delta\phi_B$ consisting of a heterogeneous interface between the emitter area and a semiconductor layer is formed at a depth $Y_B$ from said emitter area, and, above the emitter area, there are formed a thin tunnel film and a polycrystalline silicon layer 930 of a wider forbidden band than in said emitter area, in order to prevent the diffusion of the electrons injected into said emitter area.

In the following the current components in the lateral bipolar transistor will be explained, though the explanation may partly overlap with the foregoing description.

(i) Collector Current $I_C$

The collector current $I_C$ between the mutually opposed emitter and collector can be substantially determined by the following equation.

The magnitude of the emitter area opposed to the collector area in a lateral bipolar transistor can be approximately represented by $Y_E \cdot L$ wherein $Y_E$ and $L$ are respectively the depth and length of the emitter.

$$I_C = \chi_E \cdot L \left( \frac{q \cdot D_p \cdot n_i}{N_B \cdot L_p} \right)^2 \operatorname{cosech}\left( \frac{W_B}{L_p} \right) \left[ \exp\left( \frac{V_{BE}}{kT} \right) - 1 \right] \quad (1)$$

wherein q is elementary charge [C], $D_p$ is diffusion coefficient [$cm^2/s$] of positive holes, $L_p$ is diffusion length [cm] of positive holes, $n_i$ is true carrier density [$cm^{-3}$], $V_{BE}$ is emitterbase voltage, $W_B$ is base width [cm], $N_B$ is base impurity concentration [$cm^{-3}$], $T_E$ is emitter depth, L is emitter length, K is Boltzman constant [J/K], and T is absolute temperature [°K.]

(II) Base Current $I_B$

The base current $I_B$ is principally composed of three components shown in the following equations (2)–(4).

(a) Recombination current $I_{B1}$ generated in the base area $B_R$ by the positive holes flowing laterally from the emitter area $E_R$:

$$I_{B1} = \chi_E \cdot L \cdot \left( \frac{q \cdot D_p \cdot n_i^2}{N_B \cdot L_p} \right) \cdot \quad (2)$$

$$\frac{\cosh(W_B/L_B) - 1}{\sinh(W_B/L_P)} \cdot \left[ \exp\left( \frac{V_{BE}}{kT} \right) - 1 \right]$$

(b) Recombination current $I_{B2}$ generated by the positive holes flowing vertically from the emitter area $E_R$:

$$I_{B2} = (W_E \cdot L) \frac{q \cdot n_i^2 \cdot D_p}{N_B \cdot L_p} \cdot \tanh\left( \frac{\chi_B}{L_p} \right) \cdot \left[ \exp\left( \frac{V_{BE}}{kT} \right) - 1 \right] \quad (3)$$

wherein $Y_B$ is the distance in the direction of depth from the emitter area $E_R$, and $W_E$ is emitter width.

(c) Diffusion current $I_{B3}$ generated by the electrons flowing from the base area $B_R$ to the emitter area $E_R$:

$$I_{B3} = (W_E \cdot L) \frac{q \cdot n_i^2 \cdot D_n}{N_E \cdot L_n} \cdot \tanh\left( \frac{\chi_E}{L_n} \right) \cdot \left[ \exp\left( \frac{V_{BE}}{kT} \right) - 1 \right] \quad (9)$$

wherein $N_E$ is impurity concentration in the emitter area $E_R$, Ln is diffusion length of the electrons and $D_n$ is diffusion coefficient of the electrons.

In the present embodiment, particular attention is paid to the base current components $I_{B2}$ represented by the equation (3) and $I_{B3}$ represented by (4).

In the conventional lateral bipolar transistor, most of the positive holes injected from the emitter area $E_R$ flow vertically and contribute to the base current by recombination. On the other hand, in the present invention, a potential barrier $\Delta\phi_B$ is formed at a distance $Y_B$ from the emitter area $E_R$ to stop the injected carriers.

The probability of passing through said barrier is represented by $\exp(-\Delta\phi_B/kT)$.

Said probability, for example at room temperature is $\Delta\phi_B = 0.1$[eV], which is about $1/54$ of that in the conventional lateral bipolar transistor.

If $Y_B \ll L_p$, in the equation (3), since $\tanh(Y_B/L_p) \cong Y_B/L_p$, $I_{N2}$ in the lateral bipolar transistor of the present invention becomes significantly lower than that in the conventional one.

In the following there will be explained the diffusion lens $L_p$ of positive holes in the n-area.

Following equation stands for the mobility $\mu_p$ of positive holes, over a wide range of the n-impurity concentration $N_D$:

$$\mu_p = \frac{370}{1 + (N_D/8 \times 10^{17})^{1.25}} + 130[cm^2/V \cdot sec] \quad (5)$$

As will be understood from this equation (5), the mobility $\mu_p$ approaches to a constant value 500[$cm^2/V\cdot sec$] when the impurity concentration $N_D$ becomes smaller, but becomes a function of said concentration $N_D$ when it exceeds $10^{17}$[$cm^{-3}$].

On the other hand, the life $\tau_p$ of the minority carriers is represented by the following equation when the impurity concentration exceeds $10^{17}$[$cm^{-3}$]:

$$\frac{1}{\tau_p} = 7.8 \times 10^{-13} N_D + 1.8 \times 10^{-31} N_D^2 [\text{sec}^{-1}] \quad (6)$$

Based on said mobility $\mu_p$ and life $\tau_p$, the diffusion length $L_p$ of positive holes is generally represented by:

$$L_p = \sqrt{\frac{kT}{q} \cdot \mu_p \cdot \tau_p} \quad (7)$$

As will be apparent from FIG. 3, the diffusion length of positive holes is extremely long and amounts to 120[μm] at $N_D=10^{17}[\text{cm}^{-3}]$. It is still about 30[μm] even at $N_D=10^{18}[\text{cm}^{-3}]$.

In a lateral bipolar transistor of pnp type formed on a same substrate together with a usual vertical bipolar transistor of npn type, the impurity concentration of the base area becomes same as that of the collector area of said vertical bipolar transistor npn type and is as low as $10^{14}$–$5 \times 10^{17}$ [cm$^{-3}$], so that the relation $Y_B \ll L_p$ can be easily obtained. However a condition of about $Y_B \ll L_p$ is desirable.

Under such condition, said recombination current $I_{B2}$ is drastically reduced, so that the base current $I_B$ is principally governed by $I_{B1}$ and $I_{B3}$, and the current amplification factor $h_{FE}$ can be made close to that of the vertical bipolar transistor.

With the decrease of said recombination current $I_{B2}$, the base current $I_B$ is predominantly governed by the recombination current $I_{B1}$ and the diffusion current $I_{B3}$, whereas in the conventional lateral bipolar transistor, it is predominantly governed by the diffusion current $I_{B3}$.

Thus, in the present embodiment, above the emitter area, there is provided a polycrystalline layer 930 of a wider forbidden band than in said emitter area as shown in FIG. 15A, thereby preventing the diffusion of electrons.

In the conventional lateral bipolar transistor, said diffusion current $I_{B3}$ is considerably large, because a metal electrode is formed directly above the emitter area 5.

When the electrons are injected from the base area into the emitter area under a condition $W_B \ll L_n$, the diffusion current $I_{B3}$ is proportional to $W_E/L_n^2$ as will be understood from the equation (4), but, in the conventional lateral bipolar transistor, it is proportional to $1/W_E$. Thus $I_{B3}$ in the lateral bipolar transistor of the present invention is smaller, by a ratio of $W_E^2/L_n^2$, than that in the conventional lateral bipolar transistor.

Then there will be explained the diffusion length of electrons in the p$^+$-area 5.

The following relationship stands on the mobility $\mu_n$ of electrons, over a wide range of the concentration Na of p-impurity:

$$\mu_n = 232 + \frac{1180}{1 + (Na/8 \times 10^{16})^{0.9}} [\text{cm}^2/\text{V} \cdot \text{sec}] \quad (10)$$

Consequently the mobility $\mu_n$ approaches to 1412 [cm$^2$/V·sec] for a lower impurity concentration Na, and becomes equal to 232 [cm$^2$/V·sec] for an infinitely high impurity concentration Na.

On the other hand, the life $\tau_n$ of the minority carriers is represented by the following equation for an impurity concentration equal to or larger than $10^{17}[\text{cm}^{-3}]$:

$$\frac{1}{\tau_n} = (3.45 \times 10^{-12} Na) + (9.5 \times 10^{-32} Na^2) \text{ sec}^{-1} \quad (11)$$

Based on said mobility $\mu_n$ and life $\tau_n$, the diffusion length $L_n$ is generally represented by:

$$L_n = \sqrt{\frac{kT}{q} \cdot \mu_n \cdot \tau_n} \quad (12)$$

From FIG. 9, the following fact will be understood. The p-emitter area of the horizontal bipolar transistor is usually common with the base area of the vertical bipolar transistor and has therefore an impurity concentration not exceeding $10^{18}[\text{cm}^{-3}]$, and the diffusion length becomes as large as 15–70[μm] in such state. Consequently the diffusion current $I_{B3}$ in the emitter area can be sufficiently lowered if the emitter width $W_E$ is about $L_n/r$ or less.

$Si_{1-x}Ge_x$ constituting said n-area 4 shows a small carrier mobility due to the alloy effect, but, under a high impurity concentration for example equal to higher than $10^{18}[\text{cm}^{-3}]$, it behaves like Si because the carrier effect by the impurities becomes predominant.

In the structure of the present embodiment, as explained in the foregoing, the base current approaches to the value of the recombination current $I_{B1}$, and the current amplification factor $h_{FE}$ approaches to that of the vertical heterogeneous bipolar transistor. The theoretical current amplification factor in such state, if a condition $W_B \ll L_p$ is satisfied, can be represented by:

$$h_{FE} \cong \frac{I_C}{I_{B1}} \cong 2 \left( \frac{L_p}{W_B} \right)^2 \quad (13)$$

As explained in the foregoing, the present embodiment is designed to block the positive holes, injected from the p$^+$-emitter area 5, by the heterogeneous interface between the n-area 4 and the n-area 3 of mixed crystal, thereby preventing the diffusion of said positive holes into the deeper area of the substrate, and to prevent the diffusion of electrons, injected into the emitter area, by the potential barrier formed at the heterogeneous interface between the Si—Ge mixed crystal and the monocrystalline silicon.

In the following there will be explained an example of the manufacturing process of the device of the 9th embodiment shown in FIG. 14:

(1) On a p-type substrate 1, an n$^+$-embedded area 2 with an impurity concentration for example of $10^{15}$–$10^{19}[\text{cm}^{-3}]$ was formed by implantation (or diffusion) of at least an element selected from the elements of group V, such as As, Sb, P etc.

(2) An n-area 3 with an impurity concentration for example of $10^{14}$–$10^{17}[\text{cm}^{-3}]$ was formed for example by epitaxial growth.

(3) An n$^+$-area 6 (with an impurity concentration for example of $10^{17}$–$10^{20}[\text{cm}^{-3}]$) was formed for reducing the base resistance.

(4) An insulating film 100 for element separation was formed by selective oxidation or CVD, and a channel stop area 7 was formed under said insulating film 100.

(5) Ge ions were selectively implanted into the Si substrate 1 for example with an impurity concentration of $1 \times 10^{16}$–$1 \times 10^{17}[\text{cm}^{-2}]$, and a heat treatment was conducted to form an n-area 4 consisting of $Si_{1-x}Ge_x$.

(6) B$^+$ ions were implanted with a concentration of $1 \times 10^{15}$ [cm$^{-2}$], and a heat treatment was conducted to form p$^+$-areas 5, 5' constituting the emitter and the collector.

(7) An ultra thin oxide film 920, of a thickness for example not exceeding 20[Å], was formed by low-temperature oxidation for example at 500°–650° C.

(8) Polycrystalline silicon layers 930, 931 were deposited for example with a thickness of 4000[Å], then subjected to boron ion implantation for example with a concentration of $1 \times 10^{16}[\text{cm}^{-2}]$, further subjected to a heat treatment at 800°–900° C., and were patterned. In case of monocrystalline silicon, epitaxial growth was conducted for example at about 800° C.

(9) An insulation film 110 was deposited and annealed, and contact holes were opened.

(10) Al—Si (1%) for forming the electrodes 200, 201, 202 was deposited by sputtering and was subsequently patterned.

(11) The alloy formation of said Al—Si electrodes was conducted for example for 30 minutes at 450° C., and a passivation film was formed.

The semiconductor device shown in FIG. 14 was prepared through the above-explained procedure.

[Embodiment 10]

Figure 16:
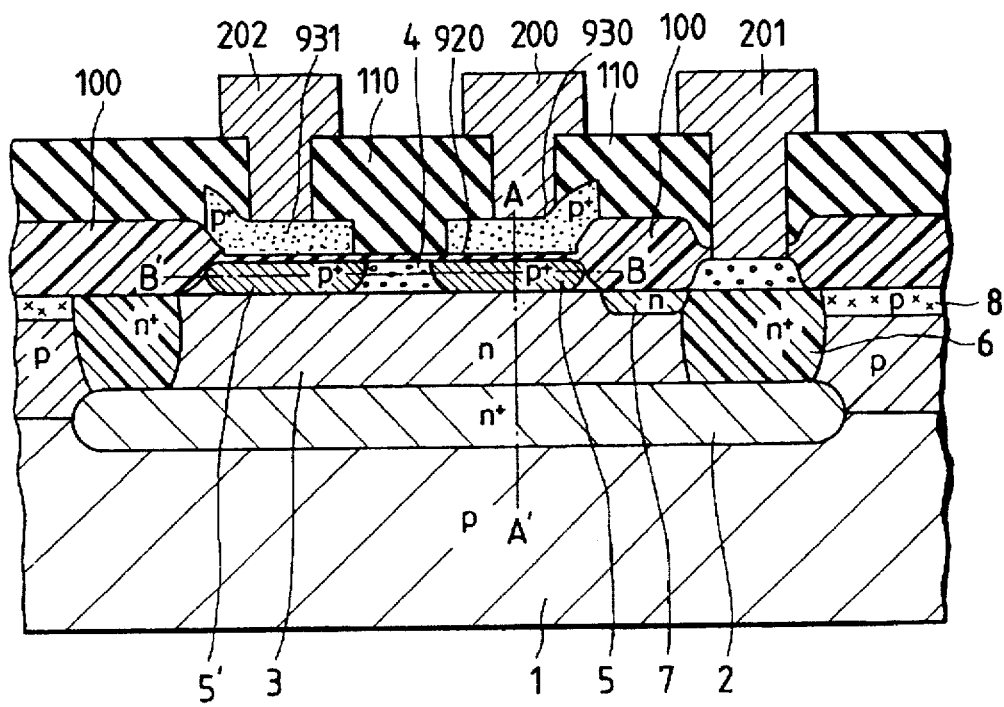
FIG. 16 is a schematic cross-sectional view of a tenth embodiment.

FIG. 16 illustrates a 10th embodiment of the present invention.

In the present embodiment, the n-area 4 of $Si_{1-x}Ge_x$ is formed not by ion implantation but by epitaxial growth, and $p^+$-areas 5, 5' constituting the emitter and the collector are subsequently formed therein. In this case, the contact of the base area is also formed by mixed crystal.

Also in the foregoing 9th embodiment, the contact area of the base area may naturally be composed of Si—Ge mixed crystal in order to reduce the contact resistance.

Though the foregoing description has been limited to a lateral bipolar transistor of pnp type, the present invention is naturally applicable to a lateral bipolar transistor of npn type. Also there may be employed a heterogeneous junction of mixed crystals of other materials. For example, Si and Si—Ge may be respectively replaced for example by GaAs and GaAlAs, or Inp and InGaPAs.

Other structures and functions are the same as those in the 9th embodiment, and will not, therefore be explained further.

[Embodiment 11]

Figure 17:
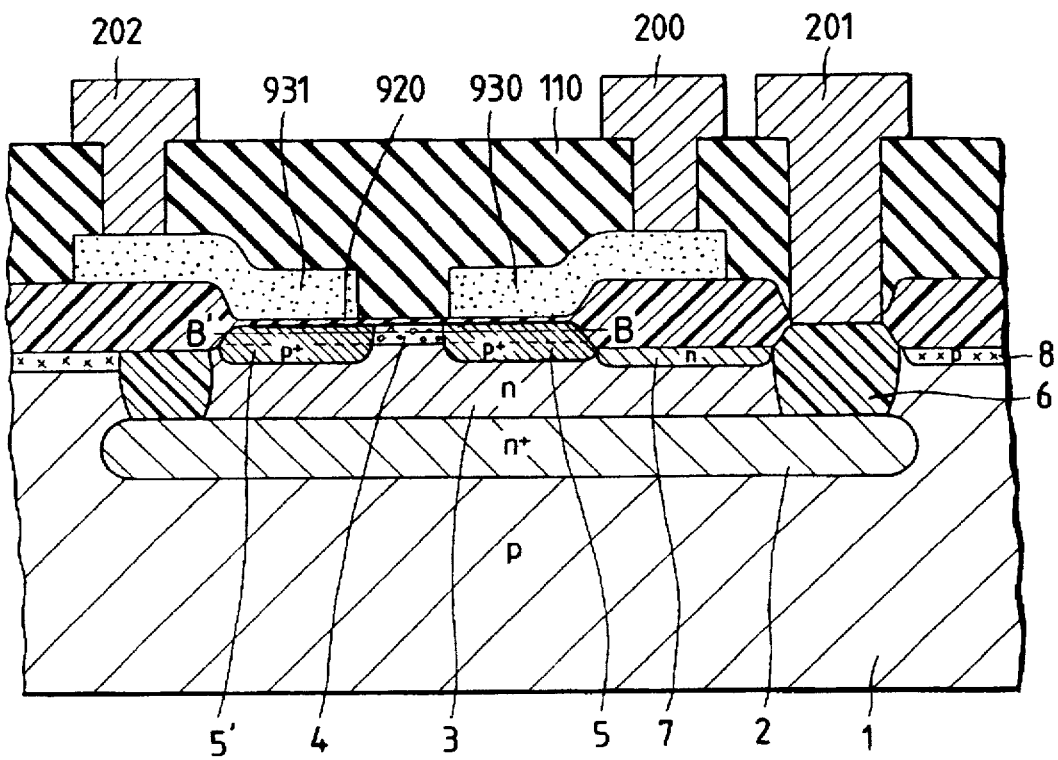
FIG. 17 is a schematic cross-sectional view of an eleventh embodiment.

FIG. 17 illustrates an 11th embodiment.

In the present embodiment, the n-area 4 consisting of $Si_{1-x}Ge_x$ is formed shallower than in the foregoing 9th embodiment. Thus the emitter depth $Y_B$ is a negative value, and the mixed crystal area consisting of $Si_{1-x}Ge_x$ is shallower than the emitter and collector areas.

The p-n junction between said n-area 4 and the $p^+$-area 5 is formed in Si—Ge, while other p-n junctions are formed in Si. As the band gap in Si—Ge is smaller than in Si as shown in FIG. 4, the current for a same applied voltage in the p-n junction in Si—Ge is larger, by $exp(\Delta E/kT)$ times, than that in Si, and this difference is about 55 times at room temperature where $\Delta E = 0.1$ eV.

The present embodiment achieves effective function of the lateral bipolar transistor by concentrating the emitter current in the vicinity of the surface of the substrate.

Other structures and functions are similar to those in the foregoing 9th embodiment, and will not, therefore, be explained further.

As explained detail in the foregoing, the present invention can provide a semiconductor device including a lateral bipolar transistor which has a high emitter-collector breakdown voltage, is capable of suppressing so-called early effect, and has a low base current, thereby capable of increasing the current amplification factor $h_{FE}$.

Also the present invention can provide a semiconductor device excellent in resistance to ambient conditions.

Furthermore, the semiconductor device of the present invention can be provided inexpensively, since the mass production technology of the conventional integrated circuits can be utilized. Furthermore the semiconductor device of the present invention has a wide field of application, since other elements such as MOS transistors can be simultaneously integrated.

The foregoing embodiments have been limited to a lateral bipolar transistor of pnp type, but the present invention is naturally applicable to a lateral bipolar transistor of npn type.

In an operation at room temperature, the value x in $Si_{1-x}Ge_x$ is preferably at least equal to 0.03, because $\Delta E$ needs to be at least to kT. At room temperature, $kT \approx 25$ meV, so that $\Delta E$ functions as a barrier if x is 0.03 or larger. Also in an operation at the temperature of liquid nitrogen, x is preferably at least equal to 0.008. Also the upper limit of the value x is preferably 1.

I claim:

1. A semiconductor device comprising:
   emitter and collector regions of a first conductivity type and a base region of a second conductivity type, arranged in a surface type lateral structure, wherein:
   said base region comprises first and second base regions; said emitter and collector regions are formed on said first base region; said second base region is formed on said first base region and, at least, between said emitter and collector regions, and has an insulating layer thereon; and the bandgaps of said second base region and said emitter and collector regions are the same and narrower than the bandgap of said first base region such that a barrier is formed between said first and said second base regions.

2. A semiconductor device according to claim 1, further comprising a semiconductor layer in contact, at a face thereof, with said emitter or collector region and, at another face thereof, with an emitter or collector electrode.

3. A semiconductor device according to claim 2, wherein said semiconductor layer contains an impurity capable of controlling the conductive type.

4. A semiconductor device according to claim 3, wherein said impurity is boron.

5. A semiconductor device according to claim 3, wherein said impurity is doped with a concentration from $10^{18}$ to $10^{20}$ $cm^{-3}$.

6. A semiconductor device according to claim 2, wherein said semiconductor layer is polycrystalline.

7. A semiconductor device according to claim 1, further comprising a semiconductor layer connected, at a face thereof, to said emitter or collector region across an oxide film and in contact, at another face thereof, with an emitter or collector electrode.

8. A semiconductor device according to claim 7, wherein said semiconductor layer contains an impurity capable of controlling the conductive type.

9. A semiconductor device according to claim 8, wherein said impurity is boron.

10. A semiconductor device according to claim 8, wherein said impurity is doped with a concentration from $10^{18}$ to $10^{20}$ $cm^{-3}$.

11. A semiconductor device according to claim 7, wherein said semiconductor layer is polycrystalline.

12. A semiconductor device according to claim 1, wherein a part of said base region contains Si atoms and Ge atoms.

13. A semiconductor device according to claim 7, wherein a part of said base region contains Si atoms and Ge atoms.

14. A semiconductor device comprising:
   a bipolar transistor comprising emitter and collector regions of a first conductivity type and a base region of a second conductivity type, arranged in a surface type lateral structure, wherein;

said base region comprises first and second base regions; said emitter and collector regions are formed at least on said first base region;

said second base region is formed on said first base region, and at least, between said emitter and collector regions; an interface between said first and second base regions operates as a barrier region composed of heterojunction, in a direction of a depth in said base region, against minority carriers injected from said emitter region into said base region;

and said emitter and collector regions are formed in a region shallower than said second base region and have the same bandgap as that of said second base region.

15. A semiconductor device according to claim 14, wherein the barrier region surrounds at least a part of the emitter region, base region and collector region.

16. A semiconductor device comprising:

emitter and collector regions of a first conductivity type and base region of a second conductivity type, arranged in a surface type lateral structure, wherein, said emitter region comprises first and second emitter regions, said first and second emitter regions forms a barrier region against minority carriers in said base region, said barrier region functioning in a direction of a depth in said emitter region, and said second emitter region is made of a polycrystalline semiconductor material having an energy band gap width wider than that of a material of said first emitter region, and is provided on said first emitter region.

17. A semiconductor device according to claim 16, wherein the depth of said emitter region is selected at least shorter than a diffusion length of the minority carriers injected from said base region.

18. A semiconductor device according to claim 16, wherein said barrier region surrounds the emitter and collector regions, a distance from said emitter region to an interface having said barrier area is at least shorter than a diffusion length of the minority carriers.

19. A semiconductor device according to claim 16, wherein an interface having said barrier is shallower than said emitter and collector regions.

20. A semiconductor device comprising emitter and collector regions of a first conductivity type and a base region of a second conductivity type, arranged in a surface type lateral structure, wherein;

said base region comprises first and second base regions, said emitter and collector regions are formed, at least, on said first base region, said second base region is formed on said first base region, and at least, between said emitter and collector regions, said semiconductor device further comprising an interface between said first base region and said second base region functioning as a barrier against transport of minority carriers in said first base region in a direction of a depth with respect to said emitter region, a thin film, formed on said emitter region, wherein a tunnel current flows through said thin film and a polycrystalline layer made of a material with an energy bandgap wider than that of a material of said emitter region is provided on said thin film.

21. A semiconductor device according to claim 20, wherein said barrier is composed of a heterojunction.

22. A semiconductor device according to claim 20, wherein the depth of said emitter region is selected at least shorter than a diffusion length of the minority carriers injected from said base region into said emitter region.

23. A semiconductor device according to claim 20, wherein a distance from said emitter region to an interface having said barrier is selected at least shorter than a diffusion length of the minority carriers injected from said emitter region.

24. A semiconductor device according to claim 20, wherein an interface having said barrier is formed shallower than said emitter and collector regions.

25. A lateral bipolar transistor comprising:

an emitter region;

a collector region laterally spaced from and facing said emitter region; and a base region disposed in-between said emitter and collector regions;

said transistor comprises:

said base region having a first portion and a second portion, the first portion being located beneath and separated from an underside of said emitter region at a depth ($X_B$) shorter than a diffusion length ($L_p$ or $L_N$) of minority carriers in a second portion of said base region, said second portion lying immediately beneath and contacting said emitter region, between said emitter region and said first portion, so as to form at its interface with said first portion, a potential barrier ($\Delta\phi_B$) against minority carriers in said second portion injected therein from said emitter region.

26. A transistor according to claim 25 wherein said potential barrier ($\Delta\phi_B$) is at least equal to a thermal energy of said minority carriers at an operating temperature.

27. A transistor according to claim 25 wherein said second portion of said base is disposed in-between said emitter and collector regions and immediately beneath said collector region.

28. A transistor according to claim 25 wherein said first and second portions of said base region have different respective band-gaps, the band-gap of said first portion being wider than the band-gap of said second portion.

29. A transistor according to claim 28 wherein sid first and second portions of said base region are heterogenous, a heterojunction thus being defined at an interface therebetween.

30. A transistor according to claim 29 wherein said first and second portions of said base region are of silicon Si, and silicon-germanium mixed composition $Si_{1-x}Ge_x$, respectively.

31. A transistor according to claim 30 wherein said base region is buried beneath a surface layer region of silicon.

32. A transistor according to claim 30 wherein said emitter region is of silicon-germanium mixed composition $Si_{1-x}Ge_x$ and has a contact of one of polycrystalline silicon and polycrystalline silicon carbide having an enhanced dopant concentration.

33. A transistor according to clam 32 wherein a thin layer of insulator material is interposed between said emitter region and said contact to define a tunnelling junction therebetween.

34. A transistor according to claim 25 wherein said base region has a third portion, which third portion is of an enhanced dopant concentration and is located immediately beneath said first portion.

35. A semiconductor device comprising:

emitter and collector regions of a first conductivity type, and a base region of a second conductivity type, arranged in a surface type lateral structure, wherein:

said base region comprises first and second base regions; said emitter and collector regions are formed on said first base region;

wherein a first region and a second region of said emitter region and a first region and a second region of said collector regions are aligned and said second base region is formed on said first base region, and between said emitter and collector regions, and said first emitter region and said first collector region each having a portion at a side of and contacting said second base region, said portion being not in contact with said first base region; said second base region has an energy bandgap narrower than energy bandgap of said first base region;

said second collector region having an energy bandgap different than said first collector region; and said second emitter region having an energy bandgap different than said first emitter region.

36. A semiconductor device according to claim 35, wherein said narrower energy band gap includes silicon and germanium atoms.

37. A semiconductor device comprising:

emitter and collector regions of a first conductivity type, a base region of a second conductivity type, and emitter and collector electrodes formed correspondingly to said emitter and collector regions, arranged in a surface type lateral structure, wherein:

said base region comprises first and second base regions; said emitter and collector regions are formed on said first base region; said second base region is formed on said first base region and between said emitter and collector regions within a range shallower than a depth of said emitter and said collector regions; a first emitter region and a first collector region each of which is a region of said emitter and said collector regions at a side of said emitter and said collector electrodes and each of which has the same depth of said second base region; said second base region has an energy bandgap narrower than the energy bandgaps of a second emitter region and a second collector region each of which is positioned at a lower part of said first collector region and said first emitter region, and said first base region; said emitter and collector electrodes are formed on said emitter and collector regions via a thin film through which a tunnel current passes; and said emitter and collector electrodes are made of polycrystalline silicon having an energy bandgap wider than that of said emitter and collector regions.

38. A semiconductor device according to claim 37, wherein said narrower energy band gap includes silicon and germanium atoms.

* * * * *

UNITED STATES PATENT AND TRADEMARK OFFICE
CERTIFICATE OF CORRECTION

PATENT NO. : 5,734,183
DATED : March 31, 1998
INVENTOR(S) : Masakazu Morishita

It is certified that error appears in the above-identified patent and that said Letters Patent is hereby corrected as shown below:

Title page, item [56] References Cited,
OTHER PUBLICATIONS, delete, "IEEE Transactions On Electron Devices, vol. 36. No. 10, Oct. 1989, pp. 2156-2164, R. L. Thorton et al., "Demonstration and Properties of a Planar Heterojunction Bipolar Transistor with Lateral Current Flow "."
"Thornton et al." should read -- R. L. Thornton et al. -- and after "Thornton et al.", "Transaction of" should read -- Transactions on -- .
After "Moravvej-Farshi et al.", "I.E.E.E." should read -- IEEE -- .

Column 1,
Line 17, "lateral," should read -- laterally, -- .

Column 2,
Line 41, "mobility" should read -- mobility, -- .

Column 4,
Line 32, "such Si" should read -- such as Si -- .

Column 6,
Line 2, "horizontal" should read -- lateral -- ;
Line 3, "$T_E$" should read -- $\chi_E$ -- at both occurrences ;
Line 7, "KT" should read -- kT -- ;
Line 10, "holes" should read -- holes, -- ;
Line 12, "$Y_E$" should read -- $\chi_E$ -- ;
Line 27, "$L_B$" should read -- $L_p$ -- ;
Line 36, "$Y_B$" should read -- $\chi_B$ -- ;
Line 50, "flows" should read -- flow -- ;
Line 51, "contributes" should read -- contribute -- ;
Line 53, "$Y_B$" should read -- $\chi_B$ -- ;
Line 60, "$Y_B$" (all occurrences) should read -- $\chi_B$ -- ; and
Line 66, "Following" should read -- The following -- .

UNITED STATES PATENT AND TRADEMARK OFFICE
CERTIFICATE OF CORRECTION

PATENT NO.   : 5,734,183
DATED        : March 31, 1998
INVENTOR(S)  : Masakazu Morishita It is certified that error appears in the above-identified patent and that said Letters Patent is hereby corrected as shown below:

Column 7,
Line 7, "[cm$^-$" should read -- [cm$^{-3}$] . -- ;
Line 8, "$_3$]." should be deleted ;
Line 32, "same" should read -- the same -- ;
Line 34, "Y$_B$" should read -- $\chi_B$ -- ;
Line 35, "Y$_B$" should read -- $\chi_B$ -- ;
Line 42, "higher)" should read -- higher), -- ;
Line 53, "Y$_E$" should read -- $\chi_E$ -- ; and
Line 56, "Y$_E$" should read -- $\chi_E$ -- .

Column 9,
Line 11, "b and" should read -- band -- .

Column 10,
Line 5, "Y$_B$" should read -- $\chi_B$ -- ;
Line 20, "Y$_E$. L" should read -- $\chi_E$ ·L -- and "T$_E$" should read -- $\chi_E$ -- ;
Line 30, "Y$_E$" should read -- $\chi_E$ -- ;
Line 45, "L$_B$" should read -- L$_p$ -- ;
Line 54, "Y$_B$" should read -- $\chi_B$ -- ; and
Line 56, "Difussion" should read -- Diffusion -- .

Column 11,
Line 2, "flows" should read -- flow -- ;
Line 3, "contributes" should read -- contribute -- :
Line 5, "Y$_B$" should read -- $\chi_B$ -- ;
Line 9, "temperature" should read -- temperature, -- ;
Line 12, "Y$_B$" (all occurrences) should read -- $\chi_B$ -- ;
Line 26, "[cm$^-$" should read -- [cm$^{-3}$]. -- ;
Line 27, "$_3$] ." should be deleted;
Line 49, "Y$_B$" should read -- $\chi_B$ -- ; and
Line 50, "Y$_B$" should read -- $\chi_B$ -- .

UNITED STATES PATENT AND TRADEMARK OFFICE
CERTIFICATE OF CORRECTION

PATENT NO. : 5,734,183
DATED : March 31, 1998
INVENTOR(S) : Masakazu Morishita

It is certified that error appears in the above-identified patent and that said Letters Patent is hereby corrected as shown below:

Column 12,
Line 5, "$Y_B$" should read -- $\chi_B$ -- ;
Line 6, "$Y_E$" should read -- $\chi_E$ -- ;
Line 8, "$Y_E^2$" should read -- $\chi_{E_2}^2$ -- ;
Line 10, "$Y_E^2$" should read -- $X_E$ -- ;
Line 14 and 38, "Following" should read -- The following -- ;
Line 29, "$\tau_n$" should read -- $\tau_n$ , -- ;
Line 45, "$Y_E$is" should read -- $X_E$ is -- ;
Line 48, "[cm" should read -- [$cm^{-3}$] , -- ; and
Line 49, "$_3$] ," should be deleted.

Column 14,
Line 1, "$Y_B$" should read -- $X_B$ -- ; and
Line 19, "same" should -- the same -- .

Column 15,
Line 40, "$Y_B$" should read -- $X_B$ -- ; and
Line 57, " $Y_E$" (both occurrences) should read $X_E$ -- .

Column 16,
Line 14, "$W_B/L_B$" should read -- $W_B/L_P$ -- ;
Line 23 and 41, "$Y_B$" should read -- $X_B$ -- ;
Line 48, "$Y_B$" (all occurrences) should read -- $X_B$ -- ;
Line 54, "Following" should read -- The following -- ;
Line 63, "[cm" should read -- [$cm^{-3}$] . -- ; and
Line 64, "$_3$]." should be deleted .

Column 17,
Line 17, "same" should read -- the same -- ;
Line 19 and 20, "$Y_B$" should read -- $X_B$ -- .

Column 18,
Line 5, " horizontal" should read -- lateral -- .

Column 19,
Line 33, "not," should read -- not -- ;
Line 40, "$Ge_x$is" should read -- $Ge_x$ is -- ;

UNITED STATES PATENT AND TRADEMARK OFFICE
CERTIFICATE OF CORRECTION

PATENT NO. : 5,734,183
DATED : March 31, 1998
INVENTOR(S) : Masakazu Morishita

It is certified that error appears in the above-identified patent and that said Letters Patent is hereby corrected as shown below:

Column 19, (cont.)
Line 41, "$Y_B$" should read -- $X_B$ -- ; and
Line 57, "detail" should read -- in detail -- .

Column 20,
Line 2, "Futhermore" should read -- Futhermore, -- ; and
Line 11, "to" (second occurrence) should be deleted.

Column 21,
Line 47, "wherein ; " should read -- wherein : -- .

Signed and Sealed this

Fourth Day of December, 2001

*Attest:*

NICHOLAS P. GODICI
*Attesting Officer*    Acting Director of the United States Patent and Trademark Office